US006560765B2

United States Patent
Mori et al.

(10) Patent No.: US 6,560,765 B2
(45) Date of Patent: May 6, 2003

(54) METHOD FOR GENERATING MASK DATA, MASK AND COMPUTER READABLE RECORDING MEDIA

(75) Inventors: Katsumi Mori, Sakata (JP); Yoshikazu Kasuya, Sakata (JP); Kei Kawahara, Isahaya (JP)

(73) Assignee: Seiko Epson Corporation (JP)

(*) Notice: Subject to any disclaimer, the term of this patent is extended or adjusted under 35 U.S.C. 154(b) by 30 days.

(21) Appl. No.: 09/808,098

(22) Filed: Mar. 14, 2001

(65) Prior Publication Data

US 2001/0039647 A1 Nov. 8, 2001

(30) Foreign Application Priority Data

Mar. 15, 2000 (JP) ........................................ 2000-072413

(51) Int. Cl.[7] .............................................. G06F 17/50
(52) U.S. Cl. .............................................. 716/19; 430/5
(58) Field of Search .............................. 716/19, 20, 21; 438/129, 424, 692; 430/5

(56) References Cited

U.S. PATENT DOCUMENTS 5,621,241 A * 4/1997 Jain ............................ 257/632
6,153,918 A * 11/2000 Kawashima et al. ........ 257/510
6,326,309 B2 * 12/2001 Hatanaka et al. ........... 438/693
6,384,464 B1 * 5/2002 Shin .......................... 257/503
6,433,438 B2 * 8/2002 Koubuchi et al. .......... 257/776

FOREIGN PATENT DOCUMENTS

JP  8-160590  6/1996
JP  9-153550  6/1997

* cited by examiner

Primary Examiner—Sara Crane
(74) Attorney, Agent, or Firm—Harness, Dickey & Pierce, P.L.C.

(57) ABSTRACT

A method is provided for generating mask data that is used for forming dummy convex regions in a specified pattern in a trench isolation region in a semiconductor device. Mask and computer readable recording medium are also provided. The method includes the steps of (a) setting a restriction region pattern 262 that defines a restriction region 40 in a semiconductor substrate, (b) setting dummy patterns 310 that define dummy convex regions 32, and (c) mixing the restriction region pattern 262 and the dummy patterns 310, wherein the dummy patterns 310 that at least partially overlap the restriction region pattern 262 are entirely excluded.

26 Claims, 19 Drawing Sheets

☐ : Dummy convex regions to be formed

┌┄┐
┊ ┊ : Dummy convex regions to be excluded
└┄┘

Fig. 18 (a) (Prior Art)
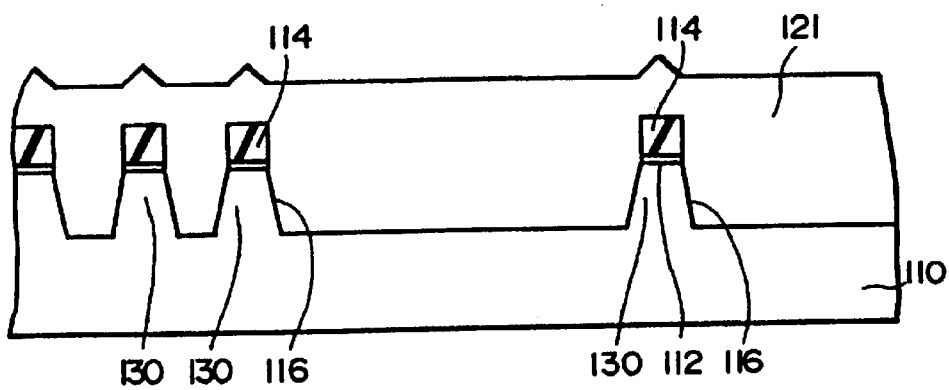
Fig. 18 (b) (Prior Art)
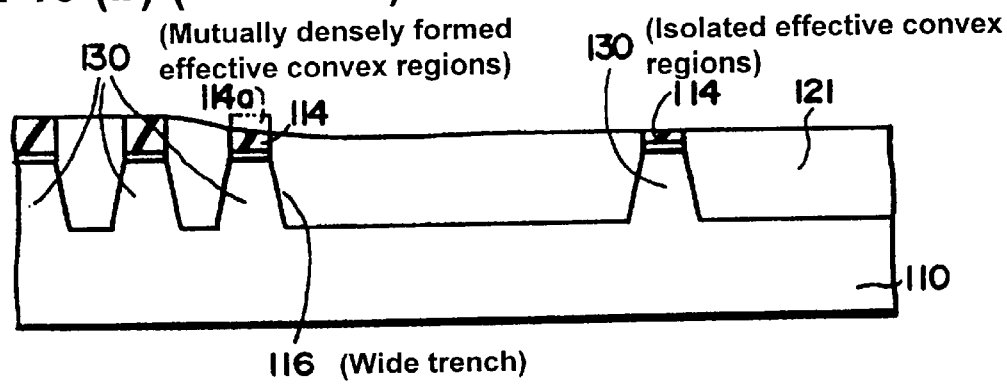
Fig. 18 (c) (Prior Art)
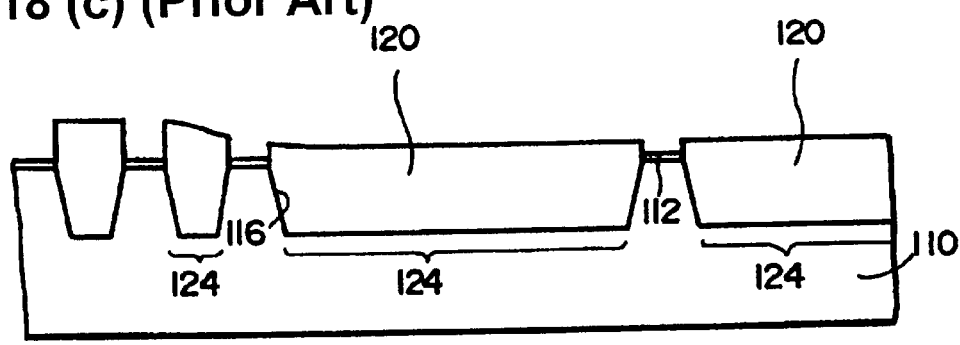

METHOD FOR GENERATING MASK DATA, MASK AND COMPUTER READABLE RECORDING MEDIA

BACKGROUND OF THE INVENTION

1. Field of the Invention

The present invention relates to a method for generating mask data, a mask, a computer readable recording medium, and more particularly a method for generating mask data, a mask, a computer readable recording medium, for forming trench isolation regions.

2. Description of Related Art

With the miniaturization of semiconductor devices (for example, MOS transistors) promoted in recent years, a further miniaturization of element isolation regions in semiconductor devices is required. In order to achieve a further miniaturization of element isolation regions in semiconductor devices, a trench isolation technique has been introduced. In the trench isolation technique, trenches are provided between semiconductor elements in a semiconductor substrate, and a dielectric material is filled in the trenches to isolate the semiconductor elements from one another. One example of the element isolation technique will be described below.

FIGS. 18(a)–18(c) show in cross-section steps of forming trench isolation regions using a conventional trench isolation technique.

FIG. 18(a) shows a silicon substrate 110 having trenches 116, and a dielectric layer 121 formed over the silicon substrate 110. A polishing stopper layer 114 is formed over effective convex regions 130 of the silicon substrate 110. A pad layer 112 is interposed between the effective convex regions 130 and the polishing stopper layer 114.

As shown in FIG. 18(b), the dielectric layer 121 is planarized using the polishing stopper layer 114 as a stopper. The planarization of the dielectric layer 121 is performed by a chemical-mechanical polishing method (hereinafter referred to as a "CMP method").

Then, as shown in FIG. 18(c), the polishing stopper layer 114 is removed to thereby form trench dielectric layers 120, whereby trench isolation regions 124 are completed.

However, as shown in FIG. 18(b), a device design may require that plural effective convex regions 130 are closely formed in one area and an isolated effective convex region 130 is formed separated from such area. In this case, the following problems occur.

When the dielectric layer 121 is planarized by the CMP method, the polishing stopper layer 114 at the isolated effective convex region 130 may be excessively cut. On the other hand, the polishing stopper layer 114 on the densely formed effective convex regions 130 may not be cut enough as compared to the polishing stopper layer 114 at the isolated effective convex region 130. This phenomenon occurs because the polishing rate differs depending on pattern densities of the effective convex regions 130. In other words, a polishing pressure is concentrated on the polishing stopper layer 114 at the isolated effective convex region 130. As a result, the polishing rate at the isolated effective convex region 130 becomes greater than the polishing rate at the densely formed effective convex regions 130. Consequently, the polishing stopper layer 114 at the isolated effective convex region 130 is excessively polished.

When the polishing stopper layer 114 at the isolated effective convex region 130 is excessively polished, the thickness of the resultant trench dielectric layer 120 becomes irregular, as shown in FIG. 18(c). Also, the polishing stopper layer 114 cannot properly perform its function. Moreover, as the isolated effective convex region 130 is excessively polished, the polishing cloth warps, and erosion occurs in the polishing stopper layer 114 in the area where the effective convex regions 130 are densely formed. The erosion is a phenomenon in which a corner section 114a of the polishing stopper layer 114 is cut. Also, when the polishing cloth warps, dishing occurs in an upper portion of the dielectric layer 121. The dishing is a phenomenon in which an upper portion of the dielectric layer 121 is formed in a dish shape.

In order to solve the problems described above, one technique, in which dummy convex regions 132 are formed in the trench 116, as shown in FIG. 19, is proposed. By the provision of the dummy convex regions 132, the polishing pressure is distributed on the dummy convex regions 132. Accordingly, the concentration of the polishing pressure on the isolated effective convex region 130 is prevented, and the polishing rate at the same region does not become excessively greater. Consequently, by the provision of the dummy convex regions 132, the isolated effective convex region 130 is prevented from being excessively cut.

The technique for forming the dummy convex regions 132 is described in Japanese laid-open patent application HEI 9-107028, Japanese laid-open patent application HEI 9-181159, Japanese laid-open patent application HEI 10-92921, Japanese laid-open patent application HEI 11-26576, U.S. Pat. No. 5,885,856 and U.S. Pat. No. 5,902,752.

SUMMARY OF THE INVENTION

It is an object of the present invention to provide a method for generating mask data, a mask, and a computer readable recording medium, which are used for forming dummy convex regions in a specified pattern in a trench isolation region.

(A) In accordance with a first embodiment of the present invention, a method is provided for generating mask data that is used for a manufacturing method for a semiconductor device. The semiconductor device has a trench isolation region, provided in a semiconductor substrate, defining a row direction and first virtual linear lines extending in a direction that traverses the row direction, and a plurality of dummy convex regions provided in the trench isolation region, wherein the row direction and the first virtual linear lines define an angle of 2 to 40 degrees, and the dummy convex regions are disposed on the first virtual linear lines. The method may include the steps of:

(a) setting a restriction region pattern that defines a restriction region;

(b) setting dummy patterns that define the dummy convex regions; and (c) mixing the restriction region pattern and the dummy patterns, wherein the dummy patterns that at least partially overlap the restriction region pattern are entirely excluded.

The "row direction" used here refers to one direction that is virtually defined in consideration of, for example, a restriction region.

In accordance with the present invention, for example, the following two effects are achieved.

(1) In accordance with the first embodiment of the present invention, the dummy patterns are set such that the dummy convex regions are disposed on the first virtual linear lines.

The row direction and the first virtual linear lines define an angle of 2 to 40 degrees. In other words, the dummy patterns are set such that adjacent ones of the dummy convex regions formed on the first virtual linear lines and disposed next to one another in the row direction are mutually offset in a column direction. Accordingly, the adjacent dummy patterns disposed in the row direction are mutually offset in the column direction. As a result, in step (c), the dummy patterns can be readily set at a high level of density in an area adjacent to a restriction region pattern that extends in the row direction. In other words, even when some of the dummy patterns overlap the restriction region pattern, the other dummy patterns are securely generated in an area adjacent to the restriction region pattern. As a consequence, dummy patterns can be securely provided in a region where a gap between adjacent restriction region patterns is narrow. As a result, the following effects are achieved.

When dummy convex regions are formed in a trench, the dummy convex regions can be securely disposed in an area adjacent to the restriction regions. As a consequence, when the dielectric layer filled in the trench is polished, the polishing pressure is securely distributed on the dummy convex regions adjacent to the restriction region.

(2) Also, in accordance with the present invention, the dummy patterns that at least partially overlap the restriction region pattern are entirely excluded. As a result, the generation of pattern skipping of dummy convex regions or scratches during polishing of the dielectric layer can be securely prevented, as described below in detail.

The first virtual linear lines may preferably be spaced a specified gap from one another. In one embodiment, the gap may preferably be 1–16 $\mu$m.

A center of each of the dummy convex regions may preferably be located on each of the first virtual linear lines.

(B) In accordance with a second embodiment of the present invention, a method is provided for generating mask data that is used for a manufacturing method for a semiconductor device, the semiconductor device comprising a trench isolation region, provided in a semiconductor substrate, defining a column direction and second virtual linear lines extending in a direction that traverses the column direction, and a plurality of dummy convex regions provided in the trench isolation region, wherein the column direction and the second virtual linear lines define an angle of 2 to 40 degrees, and the dummy convex regions are disposed on the second virtual linear lines. The method may include the steps of:

(a) setting a restriction region pattern that defines a restriction region;

(b) setting dummy patterns that define the dummy convex regions; and (c) mixing the restriction region pattern and the dummy patterns, wherein the dummy patterns that at least partially overlap the restriction region pattern are entirely excluded.

The "column direction" used here refers to one direction that perpendicularly traverses the row direction and is virtually defined in consideration of, for example, a restriction region.

In accordance with the present invention, for example, the following two effects are achieved.

(1) In accordance with the second embodiment of the present invention, the dummy patterns are set such that the dummy convex regions are disposed on the second virtual linear lines. The column direction and the second virtual linear lines define an angle of 2 to 40 degrees. In other words, the dummy patterns are set such that adjacent ones of the dummy convex regions formed on the second virtual linear lines and disposed next to one another in the column direction are mutually offset in the row direction. Accordingly, the adjacent dummy patterns disposed in the column direction are mutually offset in the row direction. As a result, in step (c), the dummy patterns can be readily set at a high level of density in an area adjacent to a restriction region pattern that extends in the column direction. In other words, even when some of the dummy patterns overlap the restriction region pattern, the other dummy patterns are securely generated in an area adjacent to the restriction region pattern. As a consequence, dummy patterns can be securely provided in a region where a gap between adjacent restriction region patterns is narrow. As a result, the effect (1) described above in conjunction with the method for generating mask data of the first embodiment can be achieved.

(2) In accordance with the second embodiment of the present invention, the dummy patterns that at least partially overlap the restriction region pattern are entirely excluded. As a result, the effect (2) described above in conjunction with the method for generating mask data of the first embodiment can be achieved.

Also, the method for generating mask data in accordance with the first embodiment and the method for generating mask data in accordance with the second embodiment may be combined. By the method for generating mask data in accordance with the combined embodiments, dummy convex regions can be more securely formed in areas adjacent to restriction regions.

In the method for generating mask data in accordance with the second embodiment of the present invention, the second virtual linear lines may preferably be spaced a specified gap from one another. The gap may preferably be 1–16 $\mu$m.

A center of each of the dummy convex regions may preferably be located on each of the second virtual linear lines.

In the method for generating mask data in accordance with the first embodiment or the second embodiment, the dummy convex regions may be formed in any one of the following manners:

(1) A plan area of the dummy convex regions is about 30–50% of a plan area of the trench isolation region. As a result, the polishing pressure can be effectively distributed on the dummy convex regions. In a preferred embodiment, the plan area of the dummy convex regions may be 40% of the plan area of the trench isolation region.

(2) Each of the dummy convex regions may have a generally rectangular shape in plan view. In other words, when the trench region formed in the silicon substrate is viewed from above, each of the dummy convex regions may have a generally rectangular shape. The formation of a dummy convex region in a generally rectangular shape is relatively easy. Preferably, each of the dummy convex regions may have a generally square shape. By forming the dummy convex regions in a generally square shape, the dummy convex regions can be more densely formed. For example, the dummy convex regions can be more securely formed in an area adjacent to a cross point where restriction regions cross one another. As a result, the dummy convex regions can be more effectively formed in an area adjacent to a restriction region with a complex pattern (for example, a prohibited area around a gate region that is formed with a complex pattern).

(3) When each of the dummy convex regions has a rectangular shape in plan (i.e., as viewed from above), adjacent ones of the dummy convex regions disposed on the first virtual linear line or adjacent ones of the dummy convex regions disposed on the second virtual linear line have sides that partially oppose to one another as viewed from above. In a preferred embodiment, the sides of the adjacent ones of the dummy convex regions are spaced a distance from one another, wherein the distance may preferably be shorter than each of the sides of each of the dummy convex regions. Preferably, the distance between the sides may be about 0.5–5 μm. More preferably, the distance between the sides may be about 1 μm.

(4) When the plan configuration of each of the dummy convex regions is rectangular, each side of each of the dummy convex regions may preferably have a length of 1 μm or greater. When each side of each of the dummy convex regions is 1 μm long or greater, the amount of data for generating masks which is used to form the dummy convex regions does not substantially increase.

In a preferred embodiment, each side of each of the dummy convex regions has a length of 10 μm or shorter. In a more preferred embodiment, each side of each of the dummy convex regions has a length of 5 μm or shorter. When each side of each of the dummy convex regions is 5 μm long or shorter, a dielectric layer deposited over the dummy convex regions is prevented from getting thicker when the dielectric layer is embedded in the trench. Accordingly, the dummy convex regions having sides that have a length of 5 μm or shorter are particularly preferable when a dielectric layer is embedded in a trench using a high-density plasma CVD.

In a more preferred embodiment, each side of each of the dummy convex regions has a length of about 2 μm.

(C) In accordance with a third embodiment of the present invention, a method is provided for generating mask data that is used for a manufacturing method for a semiconductor device. The semiconductor device has a trench isolation region, provided in a semiconductor substrate, defining a row direction and a column direction and a plurality of dummy convex regions in the trench isolation region disposed in the row direction and the column direction. Each of the dummy convex regions has a generally square shape in plan. The dummy convex regions that are disposed in the row direction are spaced a first distance from one another, the first distance being about a half of a side of each of the dummy convex regions. The dummy convex regions that are disposed in the row direction are offset by a second distance from one another in the column direction, the second distance being about a half of a side of each of the dummy convex regions. The method may include the steps of:

(a) setting a restriction region pattern that defines a restriction region;

(b) setting dummy patterns that define the dummy convex regions; and (c) mixing the restriction region pattern and the dummy patterns, wherein the dummy patterns that at least partially overlap the restriction region pattern are entirely excluded.

The "row direction" and the "column direction" may be defined in a similar manner as the first and second embodiments.

In accordance with the third embodiment of the present invention, the adjacent dummy patterns disposed in the row direction are mutually offset in the column direction. As a result, the method for generating mask data in accordance with the third embodiment of the present invention provides the same effects achieved by the method for generating mask data in accordance with the first embodiment of the present invention.

(D) In accordance with a third embodiment of the present invention, a method is provided for generating mask data that is used for a manufacturing method for a semiconductor device. The semiconductor device comprising a trench isolation region, provided in a semiconductor substrate, defining a row direction and a column direction and a plurality of dummy convex regions in the trench isolation region disposed in the row direction and the column direction, wherein each of the dummy convex regions has a generally square shape in plan, the dummy convex regions that are disposed in the column direction are spaced a first distance from one another, the first distance being about a half of a side of each of the dummy convex regions, and the dummy convex regions that are disposed in the column direction are offset by a second distance from one another in the row direction, the second distance being about a half of a side of each of the dummy convex regions. The method may include the steps of:

(a) setting a restriction region pattern that defines a restriction region;

(b) setting dummy patterns that define the dummy convex regions; and (c) mixing the restriction region pattern and the dummy patterns, wherein the dummy patterns that at least partially overlap the restriction region pattern are entirely excluded.

The "row direction" and the "column direction" may be defined in a similar manner as the first and second embodiments.

In accordance with the fourth embodiment of the present invention, the adjacent dummy patterns disposed in the column direction are mutually offset in the row direction. As a result, the method for generating mask data in accordance with the fourth embodiment of the present invention provides the same effects achieved by the method for generating mask data in accordance with the second embodiment of the present invention.

Also, the method for generating mask data in accordance with the third embodiment and the method for generating mask data in accordance with the fourth embodiment may be combined. By the method for generating mask data in accordance with the combined embodiments, dummy convex regions can be more securely formed in areas adjacent to restriction regions.

In the semiconductor device manufactured by the method in accordance with the third embodiment or the fourth embodiment, each side of each of the dummy convex regions may preferably have a length of about 2 μm.

In any one of the methods for generating mask data in accordance with the first through fourth embodiments of the present invention, the restriction region includes, for example, an effective region and a prohibited area. The effective region may include, for example, an active region, a gate region, a well region formed to function as a resistance and a boundary region between an n-well and a p-well.

(E) In accordance with a fifth embodiment of the present invention, a method is provided for generating mask data that is used for a manufacturing method for a semiconductor device. The semiconductor device has a trench isolation region provided in a semiconductor substrate and a plurality of dummy convex regions provided in the trench isolation region. The method may include the steps of:

(a) setting a restriction region pattern that defines a restriction region;

(b) setting dummy patterns that define the dummy convex regions, and defining a row direction and first virtual linear lines extending in a direction that traverses the row direction, wherein the row direction and the first virtual linear lines define an angle of 2 to 40 degrees, and the dummy convex regions are disposed on the first virtual linear lines; and (c) mixing the restriction region pattern and the dummy patterns, wherein the dummy patterns that at least partially overlap the restriction region pattern are entirely excluded.

The "row direction" used here refers to one direction that is virtually defined in consideration of, for example, a restriction region pattern.

In accordance with the fifth embodiment of the present invention, the dummy patterns are formed to be disposed on the first virtual linear lines. The row direction and the first virtual linear lines define an angle of 2 to 40 degrees. In other words, adjacent ones of the dummy patterns that are formed on the same first virtual linear line and disposed in the row direction are mutually offset in a column direction. As a result, the dummy patterns can be readily disposed at a high level of density in an area adjacent to the restriction region pattern that extends in the row direction. In other words, even when some of the dummy patterns overlap the restriction region pattern, the other dummy patterns in an area adjacent to the restriction region pattern are securely disposed. As a consequence, the dummy convex regions can be securely formed in a region adjacent to the restriction region. As a result, polishing pressure can be securely distributed on the dummy convex regions adjacent to the restriction regions when the dielectric layer filled in the trench is polished. Also, since the dummy patterns can be securely disposed in an area adjacent to the restriction regions, the dummy patterns can also be securely provided in a region where a gap between the adjacent restriction region patterns is narrow.

Also, the fifth embodiment of the present invention can achieve the effect (2) that is obtained by the method for generating mask data in accordance with the first embodiment.

(F) In accordance with a sixth embodiment of the present invention, a method is provided for generating mask data that is used for a manufacturing method for a semiconductor device. The semiconductor device has a trench isolation region provided in a semiconductor substrate and a plurality of dummy convex regions provided in the trench isolation region. The method may include the steps of:

(a) setting a restriction region pattern that defines a restriction region;

(b) setting dummy patterns that define the dummy convex regions, and defining a column direction and second virtual linear lines extending in a direction that traverses the column direction, wherein the column direction and the second virtual linear lines define an angle of 2 to 40 degrees, and the dummy convex regions are disposed on the second virtual linear lines; and (c) mixing the restriction region pattern and the dummy patterns, wherein the dummy patterns that at least partially overlap the restriction region pattern are entirely excluded.

The "column direction" used here refers to one direction that perpendicularly traverses the row direction and is virtually defined in consideration of, for example, a restriction region.

In accordance with the sixth embodiment of the present invention, the dummy patterns are formed to be disposed on the second virtual linear lines. The column direction and the second virtual linear lines define an angle of 2 to 40 degrees. In other words, adjacent ones of the dummy patterns that are formed on the same second virtual linear line and disposed in the column direction are mutually offset in the row direction. As a result, the dummy patterns can be readily disposed at a high level of density in an area adjacent to the restriction region pattern that extends in the column direction. In other words, even when some of the dummy patterns overlap the restriction region pattern, the other dummy patterns in an area adjacent to the restriction region pattern are securely disposed. As a consequence, the dummy convex regions can be securely formed in a region adjacent to the restriction region. As a result, the dummy convex regions can be securely formed in an area adjacent to the restriction regions. As a consequence, when the dielectric layer filled in the trench is polished, the polishing pressure is securely distributed on the dummy convex regions adjacent to the restriction regions.

Also, since the dummy patterns can be securely disposed in an area adjacent to the restriction regions, the dummy patterns can also be securely provided in a region where a gap between the adjacent restriction region patterns is narrow.

Also, the sixth embodiment of the present invention can achieve the effect (2) that is achieved by the method for generating mask data in accordance with the first embodiment.

Also, the method for generating mask data in accordance with the fifth embodiment and the method for generating mask data in accordance with the sixth embodiment may be combined. By the method for generating mask data in accordance with the combined embodiments, dummy patterns can be more securely formed in areas adjacent to restriction region patterns.

(G) In accordance with a seventh embodiment of the present invention, a method is provided for generating mask data that is used for a manufacturing method for a semiconductor device, wherein the semiconductor device has a trench isolation region provided in a semiconductor substrate defining a row direction and a column direction and a plurality of dummy convex regions in the trench isolation region disposed in the row direction and the column direction. Placement of the plurality of dummy convex regions may be determined by a method including the steps of:

(a) setting a restriction region pattern that defines a restriction region;

(b) setting dummy patterns that define the dummy convex regions, wherein each of the dummy convex regions has a generally square shape in plan, the dummy convex regions that are disposed in the row direction are spaced a first distance from one another, the first distance being about a half of a side of each of the dummy convex regions, and the dummy convex regions that are disposed in the row direction are offset by a second distance from one another in the column direction, the second distance being about a half of a side of each of the dummy convex regions; and (c) mixing the restriction region pattern and the dummy patterns, wherein the dummy patterns that at least partially overlap the restriction region pattern are entirely excluded.

The "row direction" and the "column direction" may be defined in a similar manner as the fifth and sixth embodiments.

In accordance with the seventh embodiment of the present invention, the adjacent dummy patterns disposed in the row direction are mutually offset in the column direction. As a result, the method for generating mask data in accordance with the seventh embodiment of the present invention provides the same effects achieved by the method for generating mask data in accordance with the fifth embodiment of the present invention.

(H) In accordance with an eighth embodiment of the present invention, a method is provided for generating mask data that is used for a manufacturing method for a semiconductor device, wherein the semiconductor device has a trench isolation region provided in a semiconductor substrate defining a row direction and a column direction and a plurality of dummy convex regions in the trench isolation region disposed in the row direction and the column direction. Placement of the plurality of dummy convex regions may be determined by a method including the steps of:

(a) setting a restriction region pattern that defines a restriction region;

(b) setting dummy patterns that define the dummy convex regions, wherein each of the dummy convex regions has a generally square shape in plan, the dummy convex regions that are disposed in the column direction are spaced a first distance from one another, the first distance being about a half of a side of each of the dummy convex regions, and the dummy convex regions that are disposed in the column direction are offset by a second distance from one another in the row direction, the second distance being about a half of a side of each of the dummy convex regions; and (c) mixing the restriction region pattern and the dummy patterns, wherein the dummy patterns that at least partially overlap the restriction region pattern are entirely excluded.

The "row direction" and the "column direction" may be defined in a similar manner as the fifth and sixth embodiments.

In accordance with the eighth embodiment of the present invention, the adjacent dummy patterns disposed in the same column direction are mutually offset in the row direction. As a result, the method for generating mask data in accordance with the eighth embodiment of the present invention provides the same effects achieved by the method for generating mask data in accordance with the sixth embodiment of the present invention.

Also, the method for generating mask data in accordance with the seventh embodiment and the method for generating mask data in accordance with the eighth embodiment may be combined. By the method for generating mask data in accordance with the combined embodiments, dummy patterns can be more securely formed in areas adjacent to restriction region patterns.

The method for generating mask data in accordance with any one of the fifth embodiment through the eighth embodiment may have any one of the following embodiments:

The restriction region includes an effective region and a prohibited area provided around the effective region, and the step (a) includes the steps of (a-1) setting an effective region pattern that defines the effective region and (a-2) setting a prohibited area pattern that defines the prohibited area about the effective region pattern.

The effective region may include an active region pattern, a gate region pattern, an impurity diffusion region pattern formed to function as a resistance and a boundary region pattern between an n-well and a p-well.

The method may further include, before step (c), step (d) of reversing the restriction region pattern. By the inclusion of step (d), the restriction region pattern and the dummy patterns can be easily mixed.

A mask in accordance with one embodiment of the present invention can be formed by the method for generating mask data described above.

By the use of the mask in accordance with the present invention in a method for manufacturing a semiconductor device, dummy convex regions can be securely formed in an area adjacent to restriction regions.

A computer readable recording medium in accordance with the present invention stores mask data obtained by the method for generating mask data according to any one of the embodiments described above.

A mask of the present invention can be formed based on the data stored in the computer readable recording medium in accordance with the present invention.

Other features and advantages of the invention will be apparent from the following detailed description, taken in conjunction with the accompanying drawings that illustrate, by way of example, various features of embodiments of the invention.

BRIEF DESCRIPTION OF THE DRAWINGS

FIGS. 18(a)–18(c) schematically show cross-sectional views of a trench isolation region in a conventional manufacturing process.

DESCRIPTION OF PREFERRED EMBODIMENTS

Preferred embodiments of the present invention will be described below with reference to the accompanying drawings.

Figure 1:
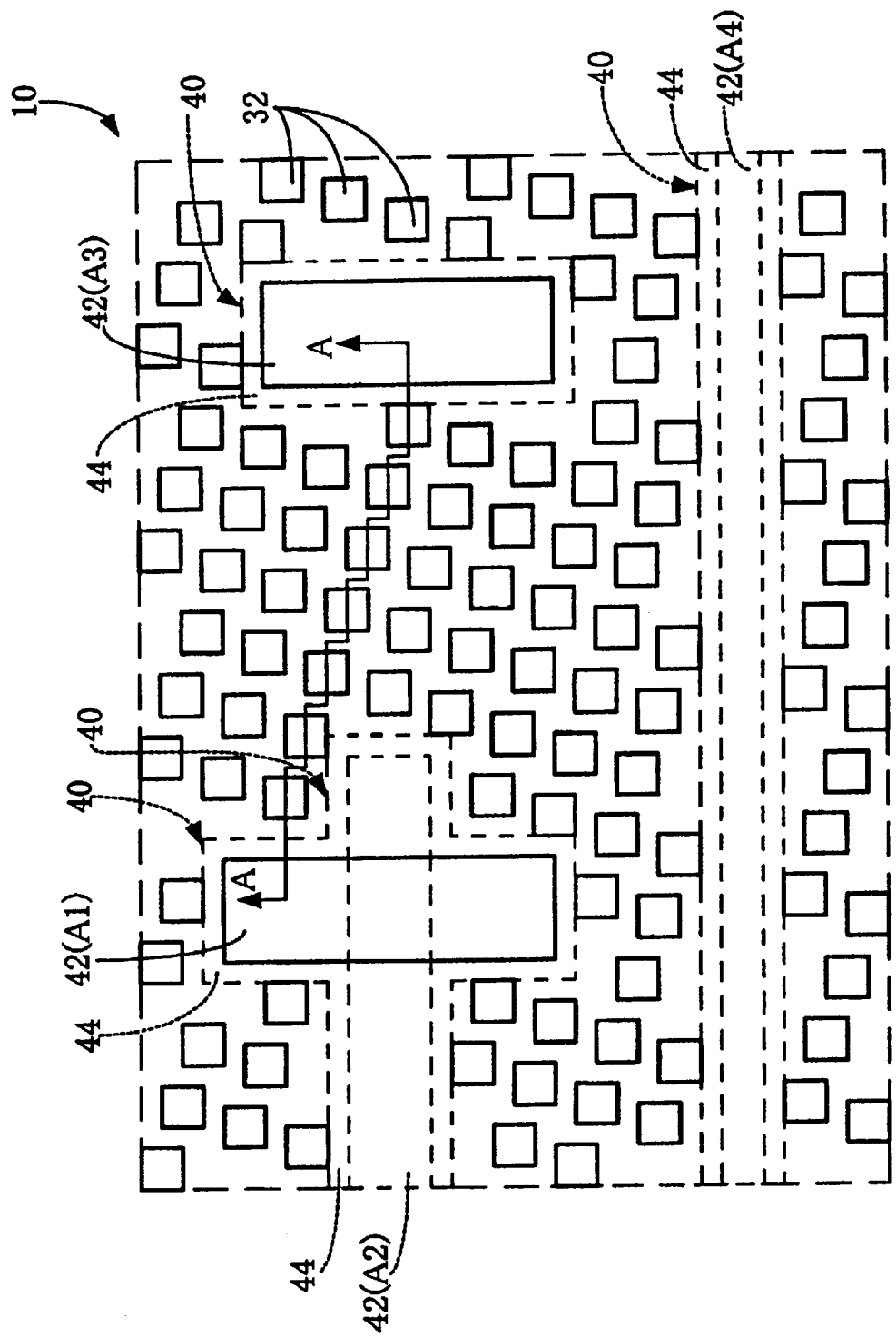
FIG. 1 shows a plan view of a semiconductor substrate having a trench isolation region.
Figure 2:
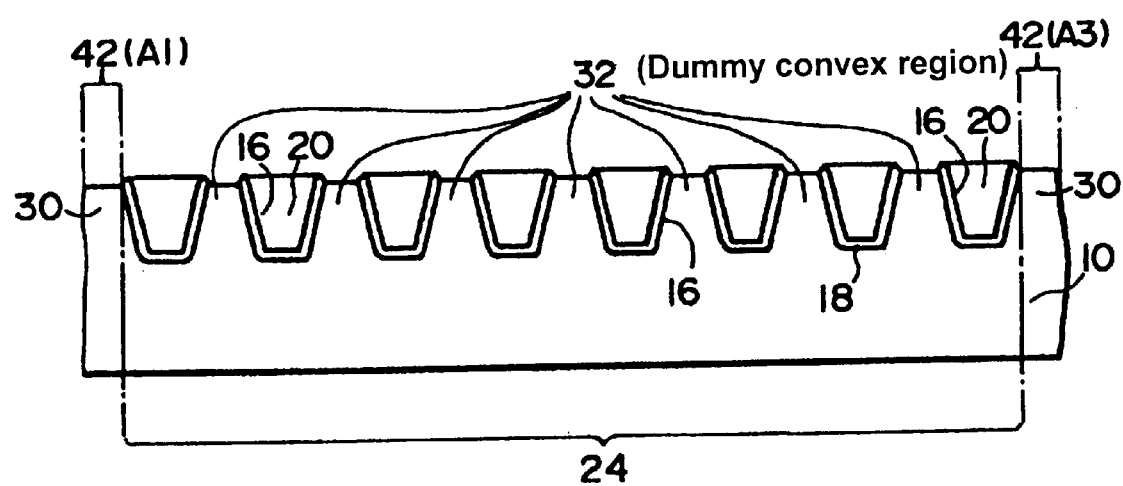
FIG. 2 schematically shows a cross-sectional view taken along a line A—A of FIG. 1.

A semiconductor device that is manufactured using a mask obtained by a method for manufacturing mask data in accordance with one embodiment of the present invention is described below. The semiconductor device of the present embodiment has a semiconductor substrate such as a silicon substrate and a trench isolation region formed in the silicon substrate. In one aspect of the present embodiment, a semiconductor substrate having a trench isolation region is formed with a novel structure. FIG. 1 shows a plan view of the semiconductor substrate having the trench isolation region. FIG. 2 generally illustrates a cross-sectional view taken along a line A—A of FIG. 1.

Restriction regions 40 are defined in the semiconductor substrate 10. The restriction regions 40 include effective regions 42 and prohibited areas 44. Each of the prohibited areas 44 is provided around each of the effective regions 42.

For example, the effective region 42 may be an active region A1, a region A2 where a gate electrode is formed (hereafter referred to as "gate region"), an impurity diffusion region A3 that is formed to function as a resistance, a boundary region A4 between a p-well and an n-well, and the like. In one embodiment, the active regions A1 and the impurity diffusion regions A3 that are formed to function as resistances are provided in effective convex regions 30.

The prohibited areas 44 are regions in which dummy convex regions 32 (to be described below) are not generated. The prohibited area 44 has a width of, for example, 0.5–20 μm, and more preferably 1–5 μm.

Dummy convex regions 32 are formed in a wide trench isolation region 24 except the restriction regions 40. In other word, the dummy convex regions 32 are formed in a manner to avoid overlapping the restriction regions 40. In one embodiment, the dummy convex regions that may entirely or partially overlap the restriction regions are not formed at all. Advantages derived from completely excluding the dummy convex regions that may partially overlap the restriction regions are described below.

If an interlayer dielectric layer is formed over the semiconductor substrate in a later stage, and a wiring layer is formed over the interlayer dielectric layer, dummy convex regions 32 may also preferably be formed below a region where the wiring layer is formed.

The prohibited areas 44 are provided around the effective regions 42 because of the following reasons.

(1) Active Region

Unless the prohibited area 44 is provided around the active region A1, dummy convex regions 32 may be formed in contact with the active region A1. In this case, the active region A1 and the dummy convex regions 32 are short-circuited, and a problem occurs in that unnecessary areas may become active regions.

(2) Gate Region

Unless the prohibited area 44 is formed around the gate region A2, dummy convex regions 32 may be formed in a manner that the dummy convex regions 32 overlap the gate region. In this case, an active region may be formed below the gate region in an area that is not required. If such an active region is formed, a charge couple is formed between the gate region and the active region. As a result, problems occur in that, for example, the original transistor characteristic is deteriorated.

(3) Impurity Diffusion Regions that are Formed to Function as Resistances

Unless the prohibited area is formed around the impurity diffusion region A3 that is formed to function as a resistance, dummy convex regions 32 are formed on the impurity diffusion region A3. Accordingly, problems occur in that, for example, the resistance value of the impurity diffusion region A3 may change.

(4) Boundary Regions between n-wells and p-wells

Unless the prohibited area 44 is formed around the boundary region A4 between the n-well and p-well, dummy convex regions 32 may be formed in the boundary region A4 between the n-well and p-well. In this case, the n-well and the p-well may contact with one another through the dummy convex regions 32. As a result, problems occur in that, for example, current leaks occur.

Figure 3:
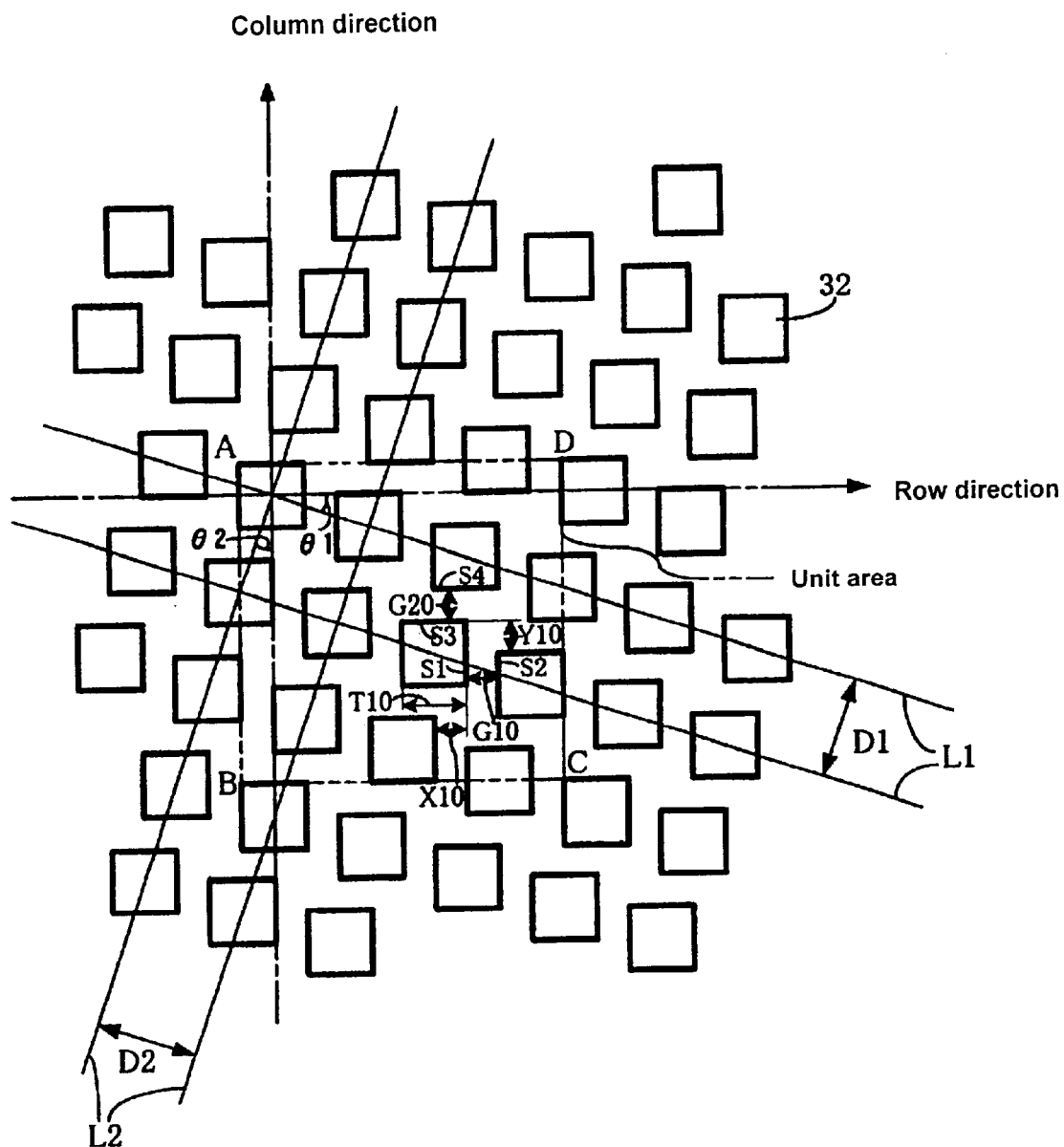
FIG. 3 is an illustration to describe a pattern of dummy convex regions.

Placement of patterns of the dummy convex regions 32 is described with reference to FIG. 3.

The dummy convex regions 32 are generally located on first virtual linear lines L1. In one embodiment, the dummy convex regions 32 can be formed in a manner that centers of the dummy convex regions 32 are located on the first virtual linear lines L1. Alternatively, the dummy convex regions 32 can be formed in a manner that portions other than the centers of the dummy convex regions 32 are located on the first virtual linear lines L1. In other words, the dummy convex regions 32 are acceptable as long as they are located on the first virtual linear lines L1.

The dummy convex regions 32 are generally located on second virtual linear lines L2. The dummy convex regions 32 can be formed in a manner that centers of the dummy convex regions 32 are located on the second virtual linear lines L2. Also, the dummy convex regions 32 can be formed in a manner that portions other than the centers of the dummy convex regions 32 are located on the second virtual linear lines L2. In other words, the dummy convex regions 32 are acceptable as long as they are located on the second virtual linear lines L2.

The dummy convex regions 32 are disposed in a direction traversing a first matrix direction (for example, a direction of rows or a direction of columns in a matrix) and also disposed in a direction traversing a second matrix direction (for example, a direction of rows or a direction of columns in the matrix). The first matrix direction may perpendicularly traverse the second matrix direction.

The first virtual linear lines L1 traverse the row direction. The first virtual linear lines L1 and the row direction define an angle θ1 that is 2–40 degrees. Preferably, the angle θ1 is 15–25 degrees. More preferably, the angle θ1 is about 20 degrees. The "row direction" used here refers to one direction that is virtually defined in view of active regions, gate regions, boundary regions between n-wells and p-wells, impurity diffusion regions that are formed to function as resistances, prohibited areas and the like.

The second virtual linear lines L2 traverse the column direction. The second virtual linear lines L2 and the column direction define an angle θ2 that is 2–40 degrees. Preferably, the angle θ2 is 15–25 degrees. More preferably, the angle θ2 is about 20 degrees. The "column direction" used here refers to one direction that is virtually defined in view of active regions, gate regions, boundary regions between n-wells and p-wells, impurity diffusion regions that are formed to function as resistances, prohibited areas and the like.

The first virtual linear lines L1 are defined in plurality. The first virtual linear lines L1 are defined to be separated from one another at a specified pitch. The first virtual linear lines L1 may be separated from one another by any distance. However, in a preferred embodiment, adjacent ones of the first virtual linear lines L1 may be separated from one another by a gap of, for example, 1–16 μm, and more preferably 2–5 μm. The second virtual linear lines L2 are defined in plurality. The second virtual linear lines L2 are defined to be separated from one another at a specified pitch. The second virtual linear lines L2 may be separated from one another by any distance. However, in a preferred embodiment, adjacent ones of the second virtual linear lines L2 may be separated from one another by a gap of, for example, 1–16 μm, and more preferably 2 –5 μm.

Adjacent ones of the dummy convex regions 32 disposed on each one of the first virtual linear lines L1 are mutually offset in the column direction. The dummy convex regions 32 may be offset in the column direction by a width Y10. In one embodiment, the width Y10 is 0.5–5 μm. In a preferred embodiment, the width Y10 is 0.5–2 μm, and more preferably about 1 μm.

Adjacent ones of the dummy convex regions 32 disposed on each one of the second virtual linear lines L2 are mutually offset in the row direction. The dummy convex regions 32 may be offset in the row direction by a width X10. In one embodiment, the width X10 is 0.5–5 μm. In a preferred embodiment, the width X10 is 0.5–2 μm, and more preferably about 1 μm.

As a top surface of the silicon substrate 10 including the trench isolation region 24 is viewed from above, a ratio of an area occupied by the dummy convex regions 32 with respect to a unit area of the trench isolation region 24 is not particularly limited. However, in a preferred embodiment, the area occupied by the dummy convex regions 32 is 30–50%, and more preferably about 40%, of a unit area of the trench isolation region 24. In one embodiment, the area occupied by the dummy convex regions 32 in a unit area may preferably be 30–50%, and more preferably about 40%.

The "unit area" used here is the minimum unit area that can be repeated in an up-to-down direction and right-to-left direction to form the entire pattern. In one embodiment, a unit area is defined by a rectangle ABCD shown in FIG. 3.

The configuration in plan view of the dummy convex region 32 is not particularly limited. For example, the dummy convex region 32 may have a polygonal shape in plan view or a circular shape in plan view. In a preferred embodiment, the dummy convex region 32 may have a polygonal shape in plan view. Preferably, the dummy convex region 32 may have a rectangular shape in plan view, and more preferably a square shape in plan view. When the dummy convex regions 32 each have a generally square shape in plan view, the dummy convex regions 32 can be more densely formed in the trench isolation region 24. For example, the dummy convex regions 32 can be more securely formed even in an area adjacent to a crossing area where restriction regions cross each other at angle. As a result, the dummy convex regions 32 can be more effectively formed in an area adjacent to a restriction region formed with a complex pattern (for example, a prohibited area around a gate region that is formed with a complex pattern).

When the configuration in plan view of the dummy convex region 32 is generally square, the length T10 of each side of the dummy convex region 32 is not particularly limited. However, for example, the length of each side of the dummy convex region 32 may be 1–10 μm. Preferably, the length of each side of the dummy convex region 32 may be 1–5 μm, and more preferably about 2 μm. When the length T10 of each side of each of the dummy convex regions 32 is 1 μm or greater, the amount of data for generating a mask, which is used to form the dummy convex regions 32, is prevented from substantially increasing. When the length T10 of each side of each of the dummy convex regions 32 is 5 μm or shorter, and when a dielectric layer 21 is embedded in the trenches 16, the dielectric layer to be deposited over the dummy convex regions 32 can have generally the same thickness of the dielectric layer that is to be deposited over the effective convex regions (for example, a circuit region) 30. Accordingly, when the dielectric layer 21 is polished in a later step (to be described below), the dummy convex regions 32 each having the side length T10 of 5 μm or shorter more securely prevent the dielectric layer 21 from remaining on the dummy convex regions 32. Also, the dummy convex regions 32 each having the side length T10 of 5 μm or shorter is particularly useful when the dielectric layer 21 is embedded in the trenches 16 using a high-density plasma CVD.

When the configuration in plan view of the dummy convex region 32 is generally square, adjacent ones of the dummy convex regions 32 disposed on the same one of the first virtual linear lines L1 have sides S1 and S2 that partially oppose to one another. A gap G10 between the partially opposing sides S1 and S2 is not particularly limited to a specific range. However, the gap G10 may preferably be 0.5–5 μm, and more preferably about 1 μm.

Also, the gap G10 may preferably be shorter than the side length T10 of each of the dummy convex regions 32. More preferably, the gap G10 may be about a half of the side length T10 of each the dummy convex regions 32.

When the configuration in plan view of the dummy convex region 32 is generally square, adjacent ones of the dummy convex regions 32 disposed on the same one of the second virtual linear lines L2 have sides S3 and S4 that partially oppose to one another. A gap G20 between the partially opposing sides S3 and S4 is not particularly limited to a specific range. However, the gap G20 may preferably be 0.5–5 μm, and more preferably about 1 μm. Also, the gap G20 may preferably be shorter than the side length T10 of each of the dummy convex regions 32. More preferably, the gap G20 may be about a half of the side length T10 of each the dummy convex regions 32.

When the configuration in plan view of the dummy convex region 32 is generally square, adjacent ones of the dummy convex regions 32 disposed next to one another in the row direction are offset by a width Y10 in the column direction. The width Y10 may preferably be about a half of the length of each side of the dummy convex region 32. Also, adjacent ones of the dummy convex regions 32 disposed next to one another in the column direction are offset by a width X10 in the row direction. The width X10 may preferably be about a half of the length of each edge of the dummy convex region 32.

The dummy convex regions 32 having the configurations described above provide at least the following effects. The effects obtained by the above-described configurations of the dummy convex regions 32 will be described below with reference to FIG. 4.

Figure 4:
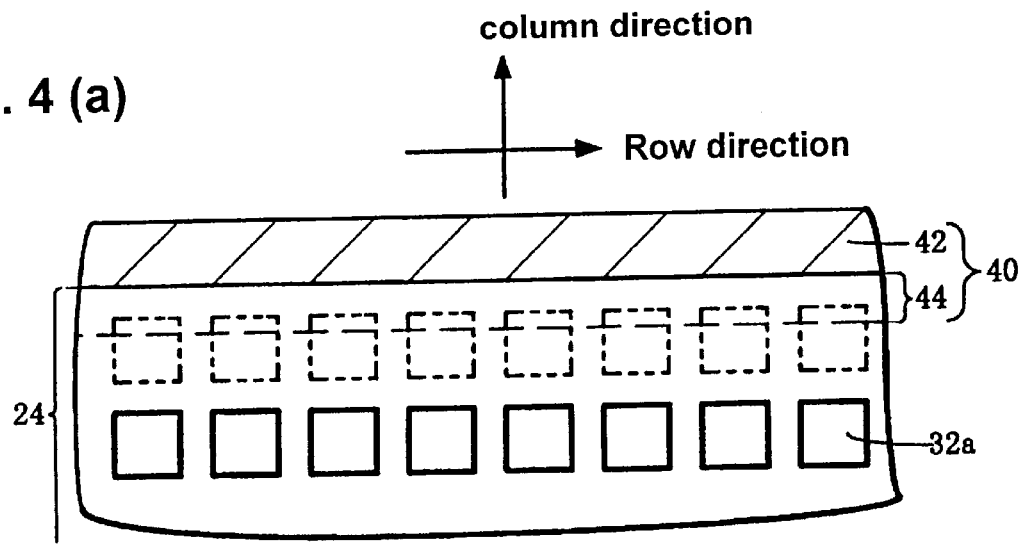
FIGS. 4(a) and 4(b) schematically show plan views of patterns of dummy convex regions formed adjacent to prohibited areas.
Figure 4:
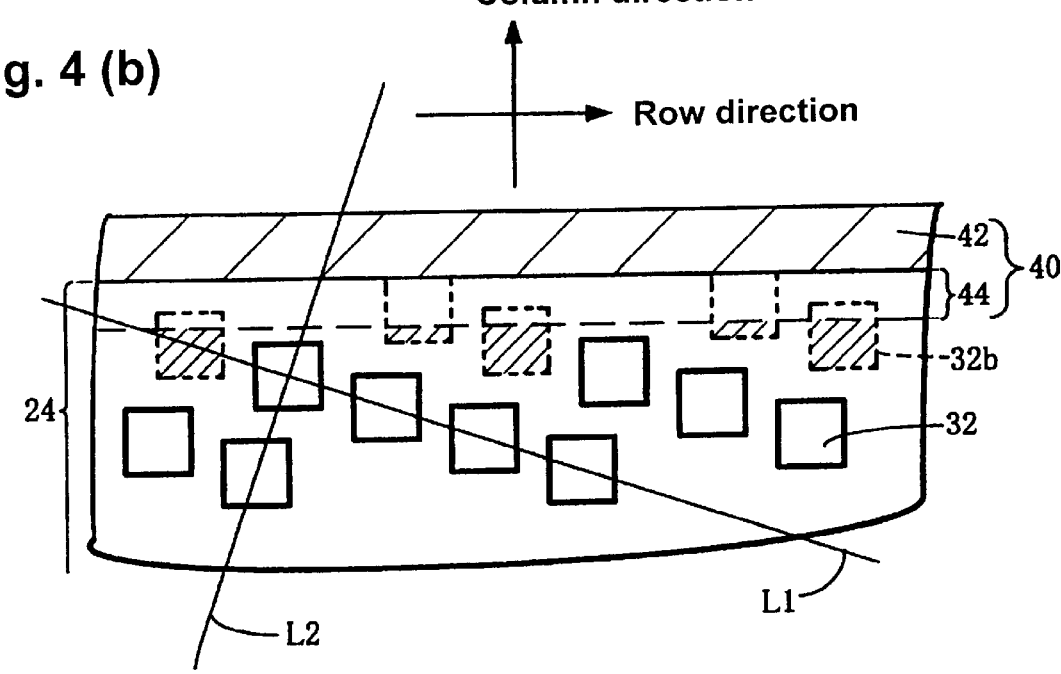

(1) For example, let us consider one case in which a restriction region 40 is provided in a manner shown in FIG. 4(*a*). The restriction region 40 includes an effective region 42 and a prohibited area 44. The prohibited area 44 extends within the trench isolation region 24 in the row direction about the effective region 42. Let us consider one situation in which dummy convex regions 32*a* in a lattice structure are formed along the restriction region 40. When the dummy convex regions 32*a* are formed in a lattice structure in parallel with the restriction region 40, and if any one of the dummy convex regions 32*a* in one of the rows of the lattice overlaps the restriction region 40, the other dummy convex regions 32*a* in the same row overlap the restriction region 40. In order to form dummy convex regions 32*a* adjacent to the restriction region 40 while preventing the dummy convex regions 32*a* from overlapping the restriction region 40, the location of the dummy convex regions 32a needs to be controlled. Such a control is technically difficult because it may cause a substantial increase in the amount of data for generating masks. On the other hand, when dummy convex regions 32a cannot be formed adjacent to the restriction region 40, the density of the dummy convex regions 32a formed in the trench isolation region 24 in an area adjacent to the restriction region 40 becomes insufficient.

However, in a semiconductor device manufactured using a mask obtained by the method for generating mask data in accordance with the embodiments of the present invention, as shown in FIG. 4(b), the dummy convex regions 32 are disposed on the first virtual linear lines L1 that extend in a direction traversing the row direction. In other words, adjacent ones of the dummy convex regions 32 disposed on the same one of the first virtual linear lines L1 are mutually offset in the column direction. As a result, even when one of the dummy convex regions 32 disposed on one of the first virtual linear lines L1 overlaps the restriction region 40, the next one of the dummy convex regions 32 on the same first virtual linear line L1 can be disposed without overlapping the restriction region 40. As a result, the dummy convex regions 32a can be securely formed in an area adjacent to the restriction region 40 without substantially controlling the locations where the dummy convex regions 32 are formed.

Also, in accordance with the embodiments of the present invention, the dummy convex regions 32 are disposed on the second virtual linear lines L2 that extend in a direction traversing the column direction. In other words, adjacent ones of the dummy convex regions 32 disposed on the same one of the second virtual linear lines L2 are mutually off set in the row direction. As a result, even when one of the dummy convex regions 32 disposed on one of the second virtual linear lines L2 overlaps the restriction region 40, the next one of the dummy convex regions 32 on the same second virtual linear line L2 can be disposed without overlapping the restriction region 40. Accordingly, the dummy convex regions 32 can be securely formed adjacent to the restriction region 40 that extends in the column direction.

(2) In the semiconductor device in accordance with the embodiments of the present invention, dummy convex regions 32 that partially overlap a restriction region are entirely eliminated. As a result, the following effects are obtained.

If dummy convex regions 32 partially overlap a restriction region 40, portions (hatched areas) 32b of the dummy convex regions 32 do not overlap the restriction region 40. The portions 32b are hereafter referred to as "hangover dummy convex regions". The hangover dummy convex region 32b has a shape in plan view that lacks a portion of the plan shape of the original dummy convex region 32. In other words, the hangover dummy convex region 32b has a smaller plan area compared to a plan area of the original dummy convex region 32. When the hangover dummy convex region 32b is extremely small in plan area (for example, when it is smaller than the resolution limit or the design rule), the following problems may occur.

(a) A resist layer to define the hangover dummy convex regions 32b is difficult to form, and pattern skipping of the hangover dummy convex regions 32b occurs. (b) Even if a resist layer to define the hangover dummy convex regions 32b is formed, the resist layer may fall. The fallen resist layer becomes dusts in an etching step to form trenches, and therefore deteriorates the etching step. (c) When an etching is conducted to form the convex regions 32, convex portions of the hangover dummy convex regions 32b become very narrow, and therefore may break in a washing step to wash the substrate. The broken convex portions become foreign particles that may remain on the surface of the substrate. (d) If the foreign particles on the surface enter a dielectric layer, scratches may occur in the dielectric layer when the dielectric layer is polished.

In accordance with the embodiments of the present invention, any hangover dummy convex regions 32b are not formed. As a result, the occurrence of the problems described above is securely prevented.

Figure 15:
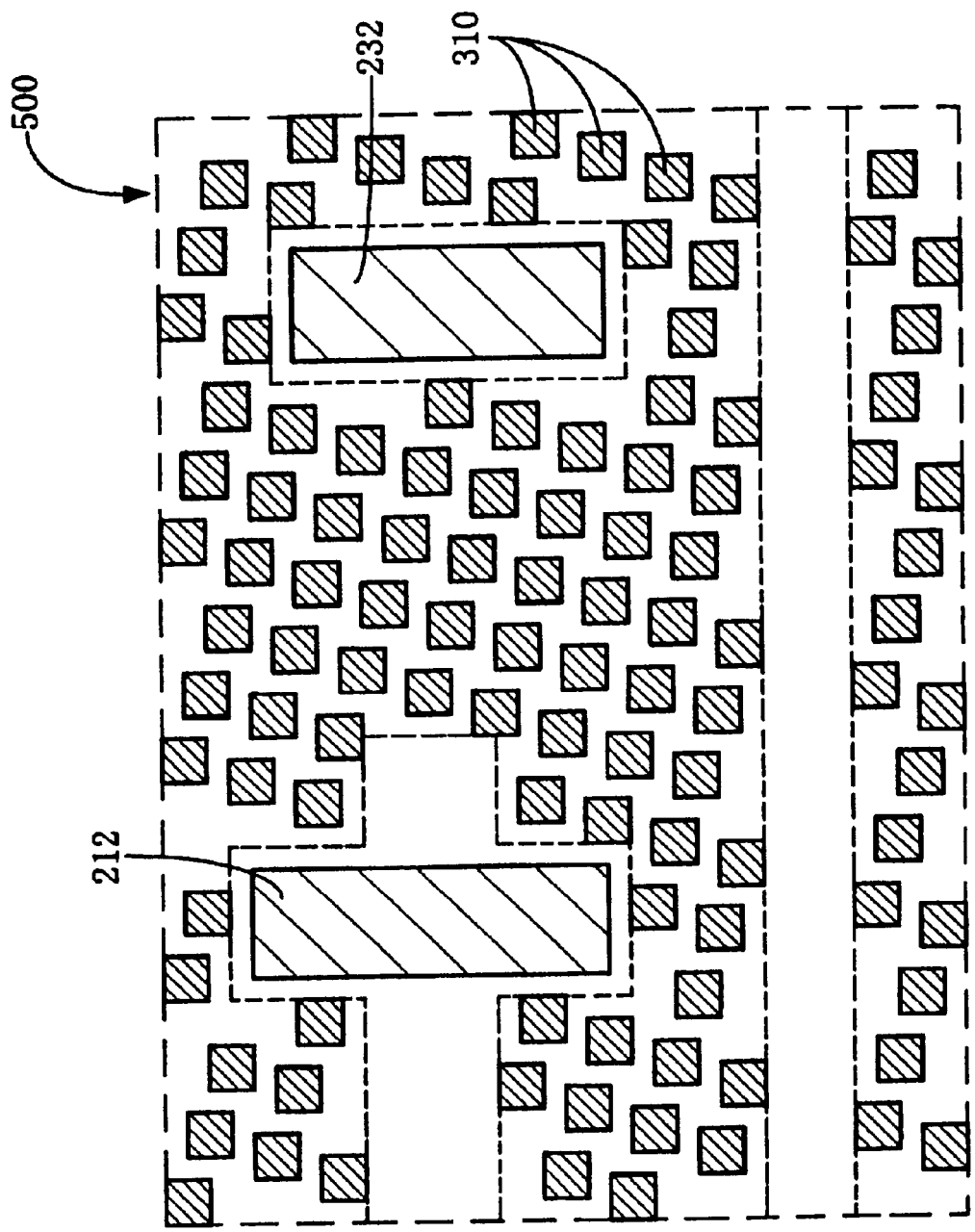
FIG. 15 shows a figure representing mask data.

One example of a method for generating mask data is described below. The mask data is used for forming trench isolation regions in a semiconductor substrate. The mask data can be generated using a computer. FIG. 15 shows a pattern representing a mask data set.

First, data for a first mask is generated. FIG. 11 shows a pattern representing first mask data 200. Restriction region patterns 262 that define restriction regions 40 are set in the first mask data 200. The first mask data 200 is formed in a manner described below. FIGS. 5–10 show steps of forming the first mask data that include intermediate mask data sets.

For example, the first mask data 200 is formed in the following manner.

Initially, first through fourth intermediate mask data 210, 220, 230 and 240, which represent regions shown in FIGS. 5 through 8, respectively, are prepared.

Figure 5:
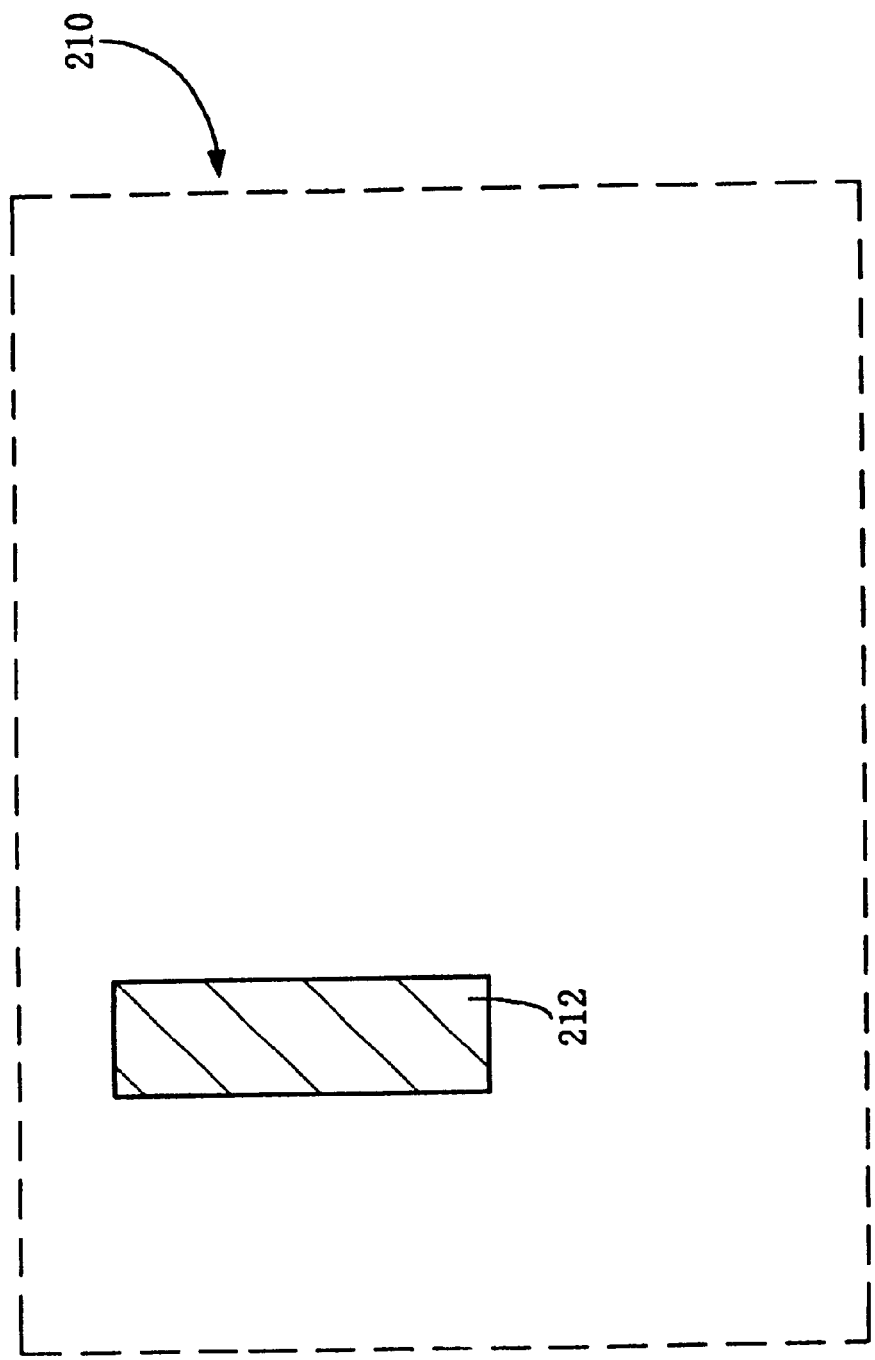
FIG. 5 shows an intermediate mask data representing one pattern used in a process for forming first mask data.
Figure 6:
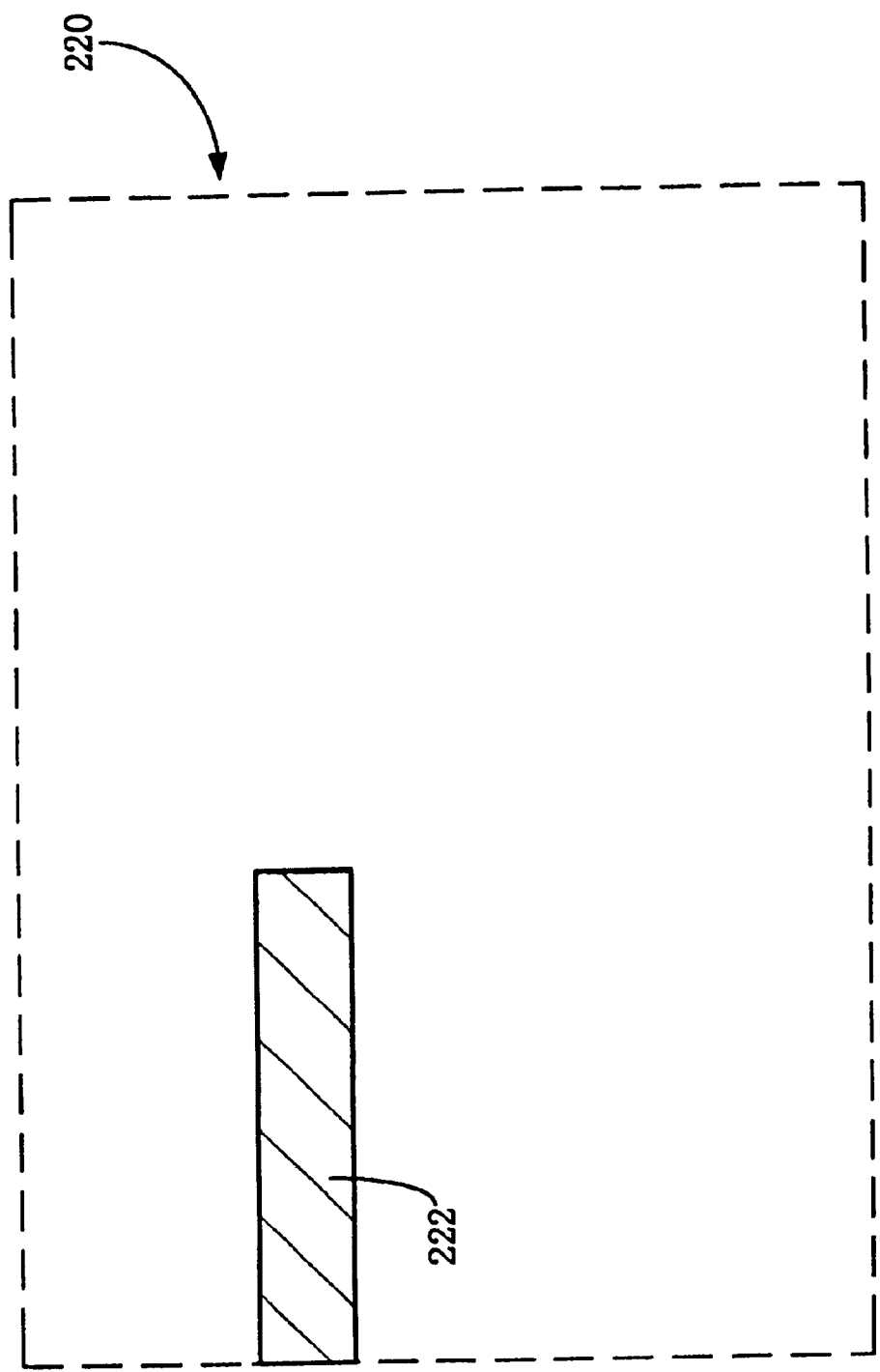
FIG. 6 shows an intermediate mask data representing one pattern used in the process for forming the first mask data.
Figure 7:
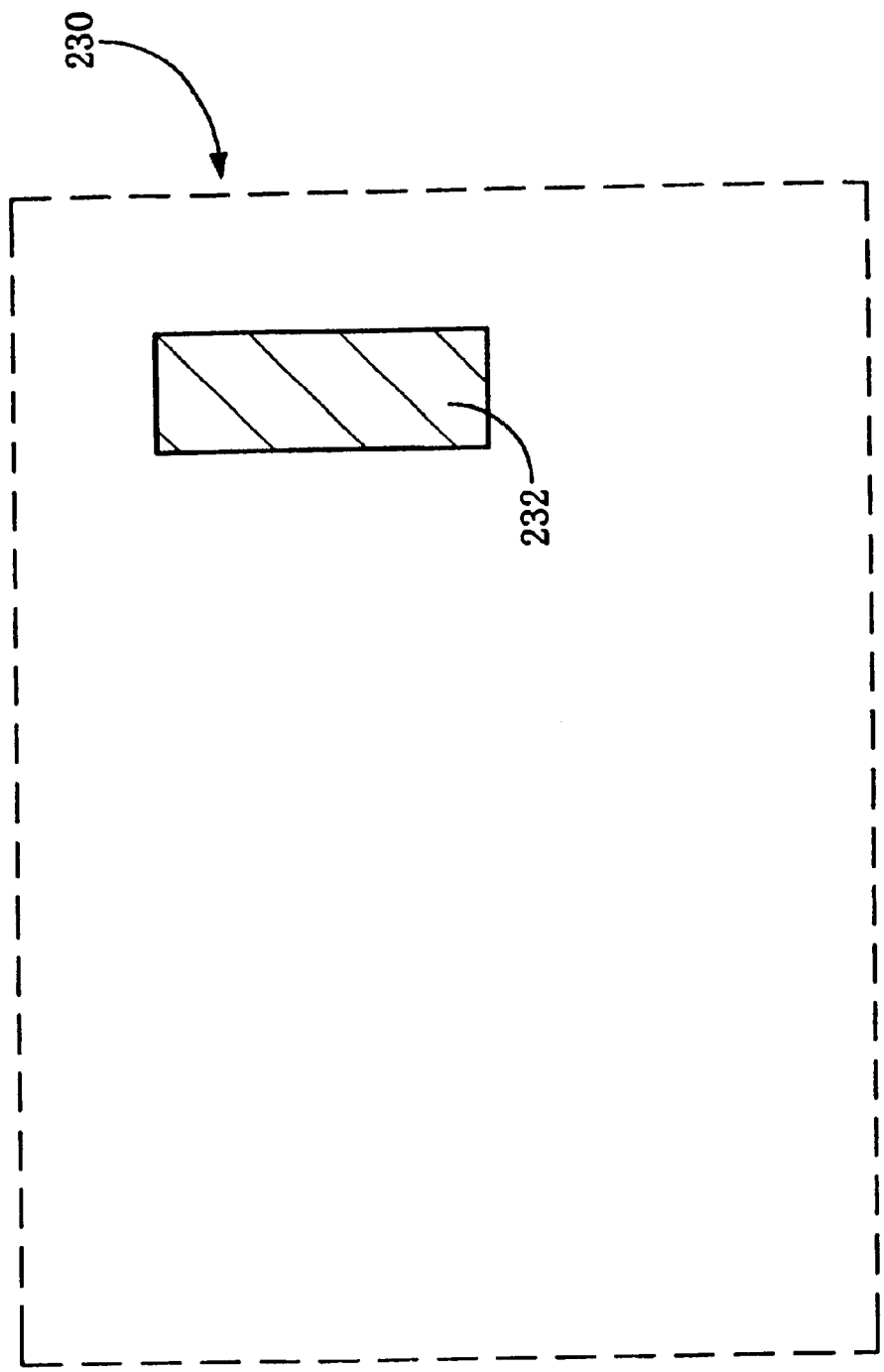
FIG. 7 shows an intermediate mask data representing one pattern used in the process for forming the first mask data.
Figure 8:
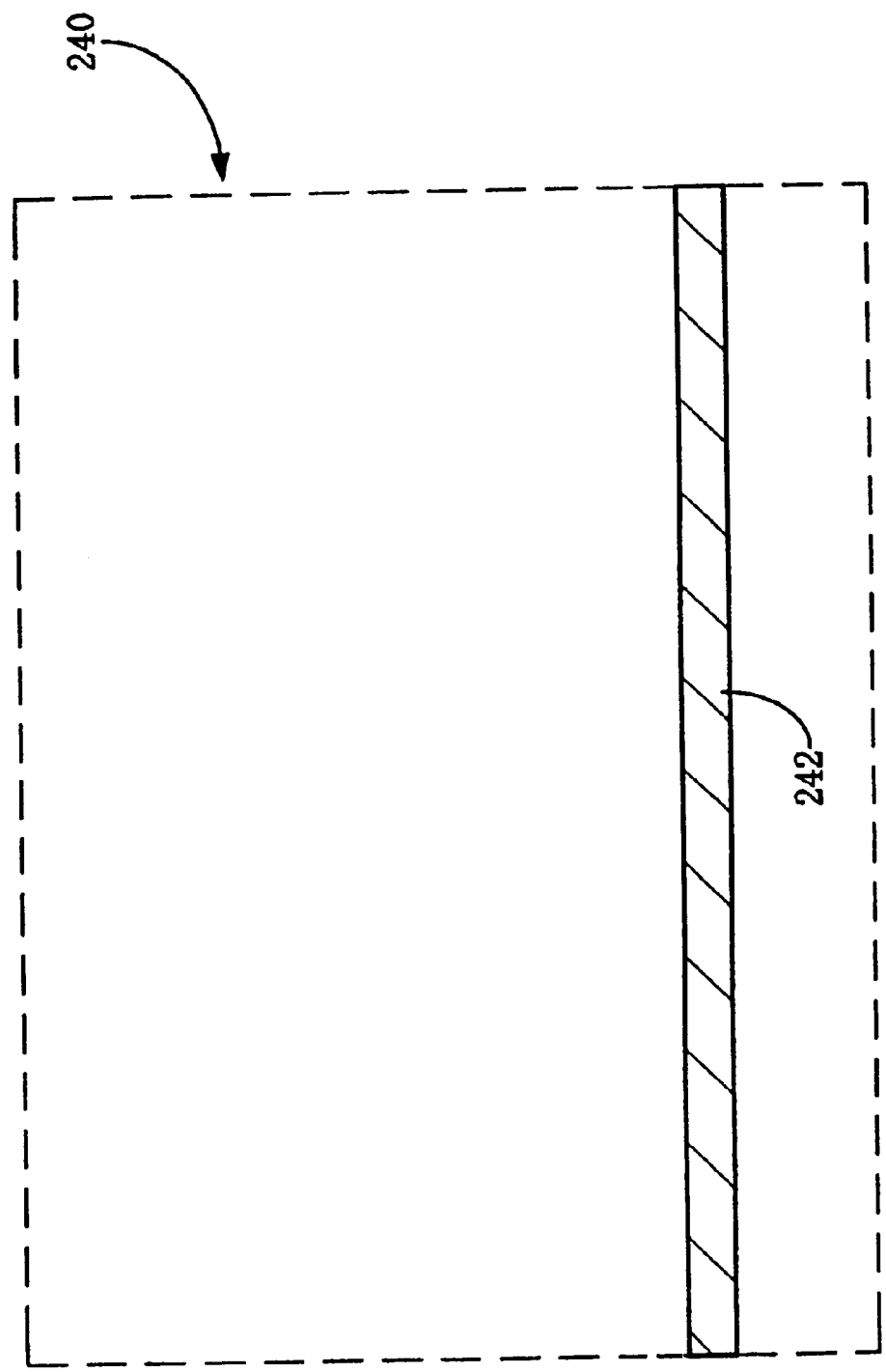
FIG. 8 shows an intermediate mask data representing one pattern used in the process for forming the first mask data.

An active region pattern 212 is defined in the first intermediate mask data 210 shown in FIG. 5. The active region pattern 212 defines an active region A1. A gate region pattern 222 is defined in the second intermediate mask data 220 shown in FIG. 6. The gate region pattern 222 defines a gate region A2. An impurity diffusion region pattern 232 for an impurity diffusion region that is to be used as a resistance is defined in the third intermediate mask data 230 shown in FIG. 7. The impurity diffusion region pattern 232 defines an impurity diffusion region A3 that is to be used as a resistance. A boundary region pattern 242 for a boundary region between a p-well and an n-well is defined in the fourth intermediate mask data 240 shown in FIG. 7. The boundary region pattern 242 defines a boundary region A4 between a p-well and an n-well.

Figure 9:
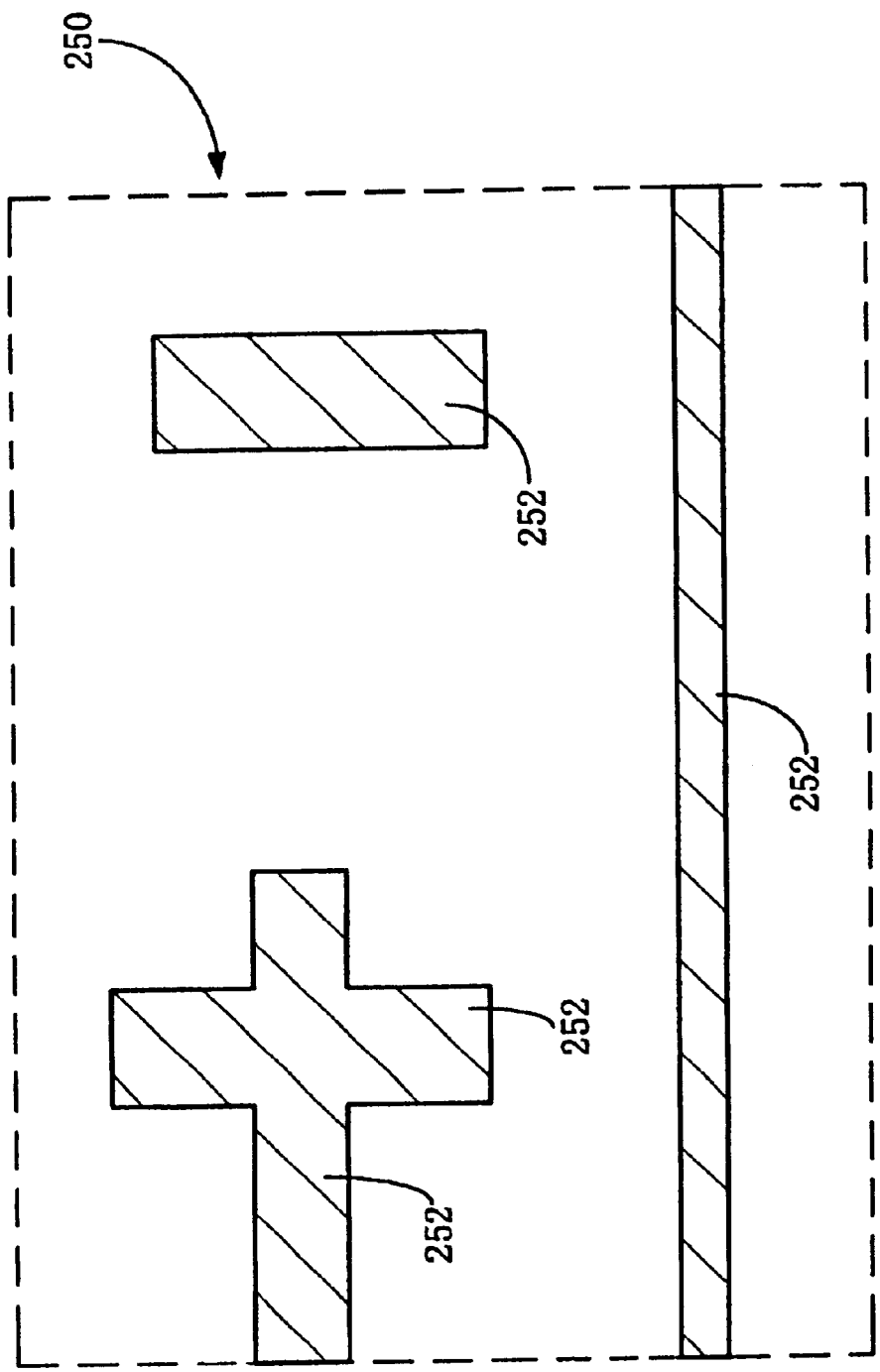
FIG. 9 shows an intermediate mask data representing one pattern used in the process for forming the first mask data.

Then, a logical sum of the first through fourth intermediate mask data 210, 220, 230 and 240 is made to obtain fifth intermediate mask data 250 shown in FIG. 9. In other words, the hatched regions 212, 222, 232 and 242 of the first through fourth intermediate mask data 210, 220, 230 and 240 are added to define effective region patterns 252 in the fifth intermediate mask data 250. The effective region patterns 252 define effective regions 42.

Figure 10:
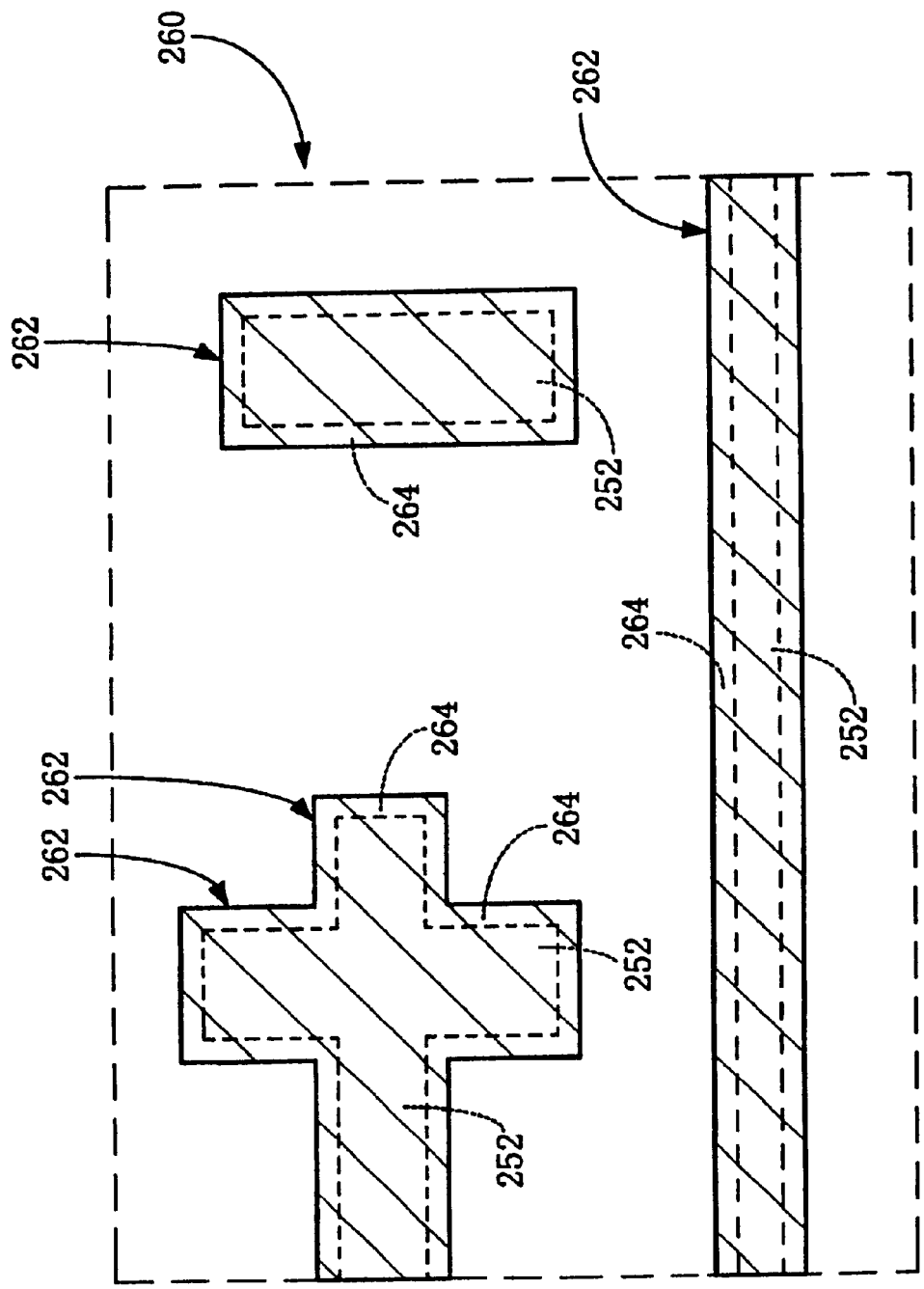
FIG. 10 shows an intermediate mask data representing one pattern used in the process for forming the first mask data.
Figure 11:
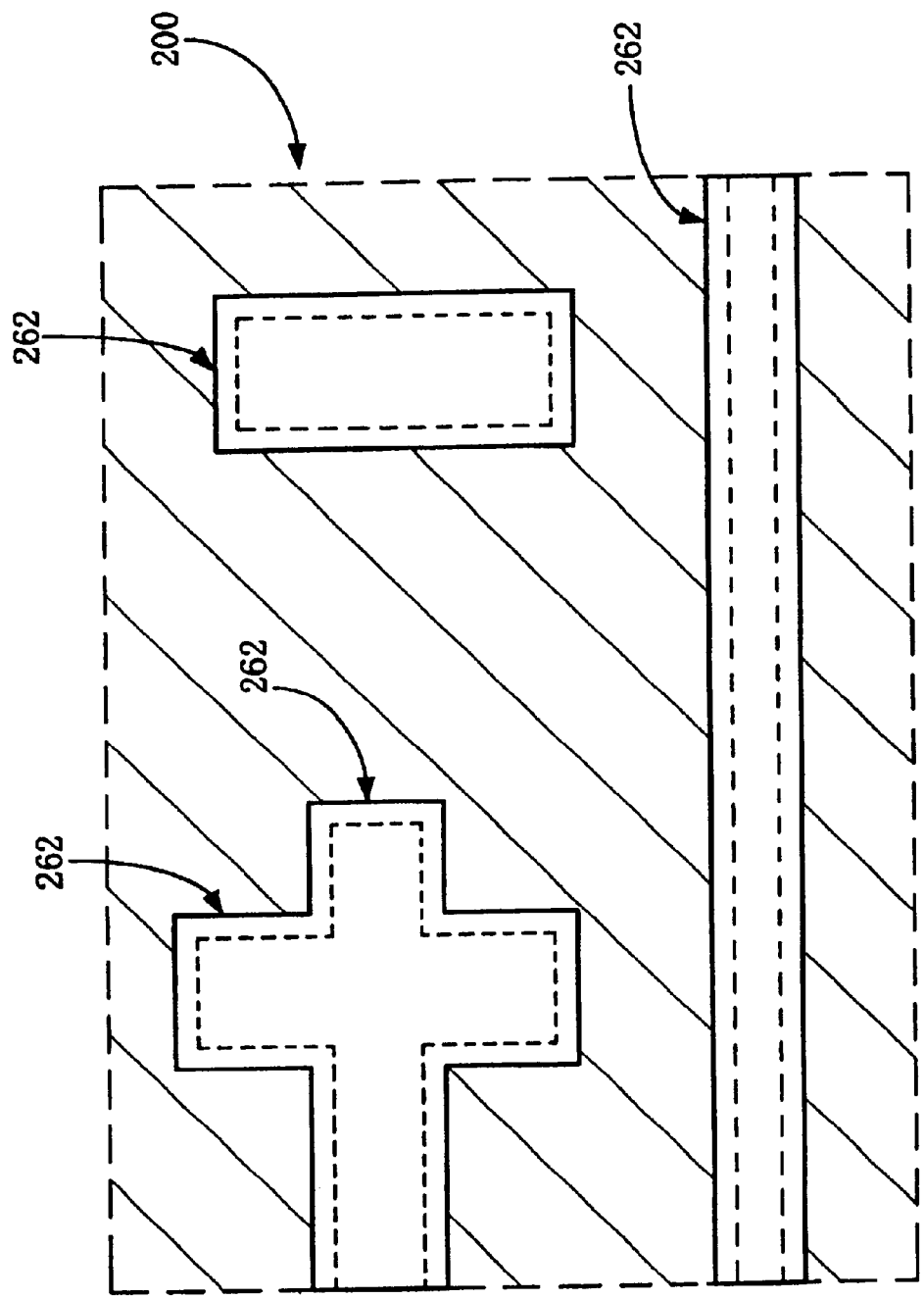
FIG. 11 shows a figure representing the first mask data.

Then, the effective region patterns 252 are expanded by a specified width to obtain sixth intermediate mask data 260 shown in FIG. 10. In other words, prohibited area patterns 264 are added around the effective region patterns 252 to set the restriction region patterns 262. The prohibited area patterns 264 define prohibited areas. The restriction region patterns 262 define restriction regions.

Then, the sixth intermediate mask data 260 is diagrammatically reversed to obtain the first mask data 200 shown in FIG. 11. More particularly, the hatched regions in the sixth intermediate mask data 260 are changed to blank regions, and the blank regions in the sixth intermediate mask data 260 are replaced with hatched regions, to generate the first mask data 200.

Figure 12:
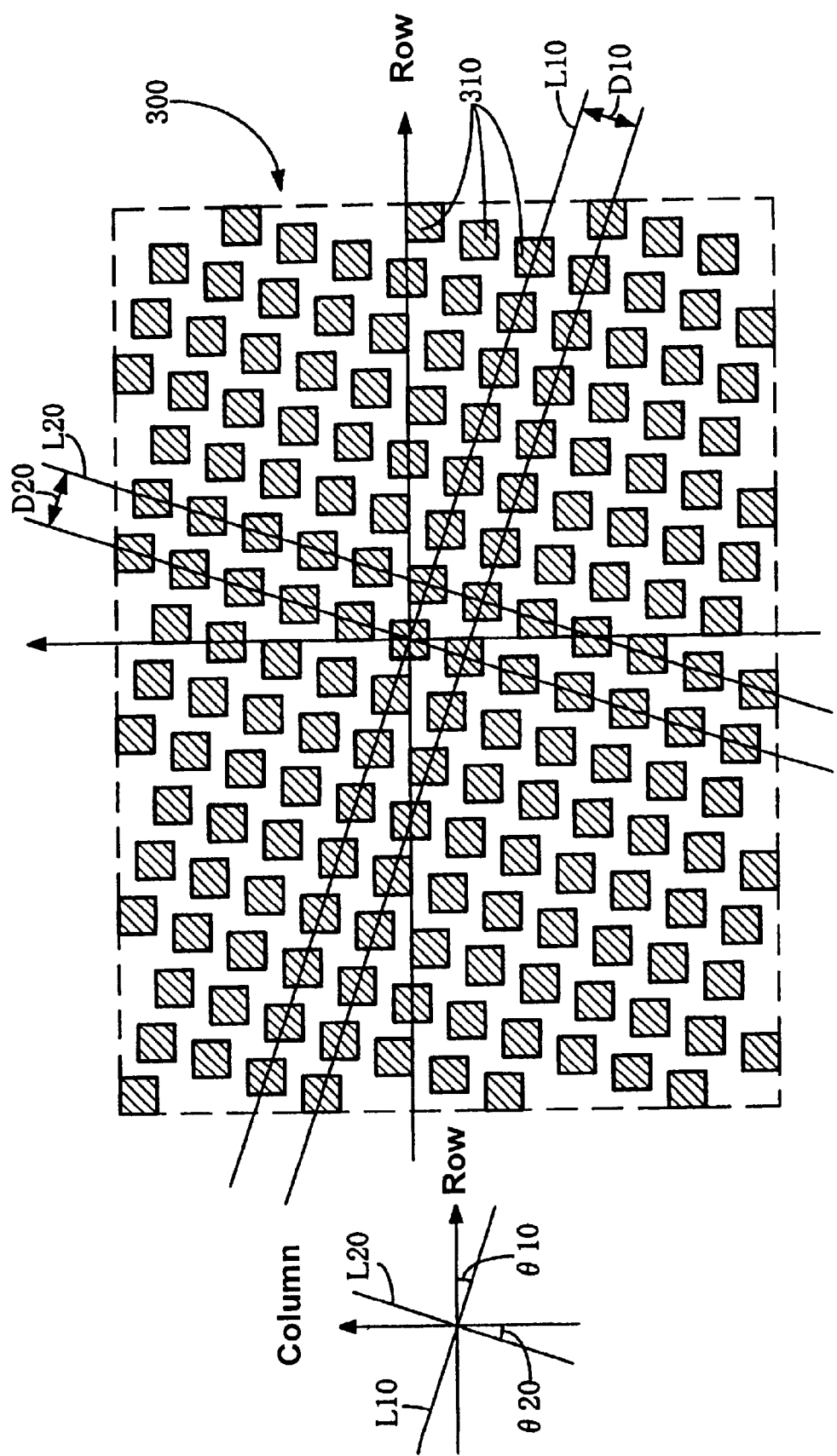
FIG. 12 shows a figure representing second mask data.
Figure 13:
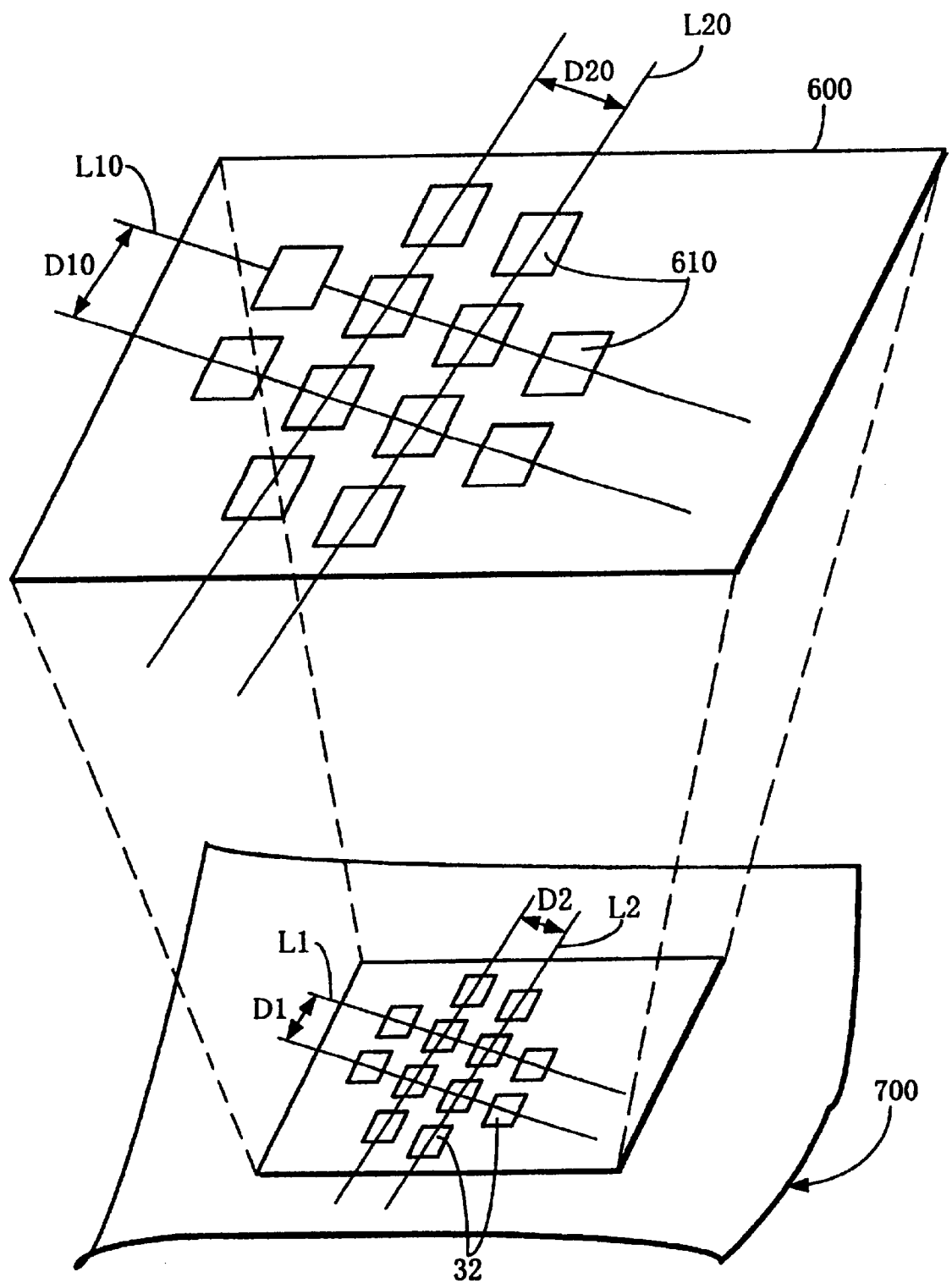
FIG. 13 shows figures indicating the relation between dummy patterns in a mask and patterns of dummy convex regions in a semiconductor device when the mask is formed based on the second mask data.

Next, second mask data 300 is formed. FIG. 12 shows a pattern representing the second mask data 300. Dummy patterns 310 are defined in the second mask data 300. The dummy patterns 310 correspond to the patterns of the above described dummy convex regions 32 and thus define the dummy convex regions 32. In other words, the dummy patterns 310 and placement patterns of the dummy convex regions 32 are identical or approximate to one another. More particularly, as shown in FIG. 13, when a mask 600 having dummy patterns 610 is formed based on the second mask data 300, the dummy patterns 610 of the mask 600 correspond to the patterns of the dummy convex regions 32 to be formed in a semiconductor device 700.

In a preferred embodiment, the dummy patterns 310 are disposed in the following manner.

The dummy patterns 310 may be located on first virtual linear lines L10. In one embodiment, the dummy patterns 310 can be formed in a manner that centers of the dummy patterns 310 are located on the first virtual linear lines L10. Alternatively, the dummy patterns 310 can be formed in a manner that portions other than the centers of the dummy patterns 310 are located on the first virtual linear lines L10. In other words, the dummy patterns 310 are accepted as long as they are located on the first virtual linear lines L10.

The dummy patterns 310 may be located on second virtual linear lines L20. In one embodiment, the dummy patterns 310 may be formed in a manner that centers of the dummy patterns 310 are located on the second virtual linear lines L20. Alternatively, the dummy patterns 310 can be formed in a manner that portions other than the centers of the dummy patterns 310 are located on the second virtual linear lines L20. In other words, the dummy patterns 310 are accepted as long as they are located on the second virtual linear lines L20.

The first virtual linear lines L10 traverse the row direction. The first virtual linear lines L10 and the row direction define an angle θ10 that is 2–40 degrees. Preferably, the angle θ10 is 15–25 degrees. More preferably, the angle θ10 is about 20 degrees. The "row direction" used here refers to one direction that is virtually defined in view of, for example, active region patterns, gate region patterns, boundary region patterns representing boundary regions between n-wells and p-wells, impurity diffusion region patterns representing impurity diffusion regions that are formed to function as resistances, prohibited area patterns and the like.

The second virtual linear lines L20 traverse the column direction. The second virtual linear lines L20 and the column direction define an angle θ20 that is 2–40 degrees. Preferably, the angle θ20 is 15–25 degrees. More preferably, the angle θ20 is about 20 degrees. The "column direction" used here refers to one direction that perpendicularly traverses the row direction and is virtually defined in view of, for example, active region patterns, gate region patterns, boundary region patterns representing boundary regions between n-wells and p-wells, impurity diffusion region patterns representing impurity diffusion regions that are formed to function as resistances, prohibited area patterns and the like.

The first virtual linear lines L10 are defined in plurality. The first virtual linear lines L1 are defined to be separated from one another at a specified pitch. The second virtual linear lines L2 are defined in plurality. The second virtual linear lines L2 are defined to be separated from one another at a specified pitch. A gap D10 between adjacent ones of the first virtual linear lines L10 is set such that a gap D1 between adjacent ones of the first virtual linear lines L1 in a semiconductor device acquires a designed amount (see FIG. 13). Also, a gap D20 between adjacent ones of the second virtual linear lines L20 is set such that a gap D2 between adjacent ones of the second virtual linear lines L2 in the semiconductor device acquires a designed amount (see FIG. 13).

It is noted that the second mask data can be formed before the first mask data is formed.

Figure 14:
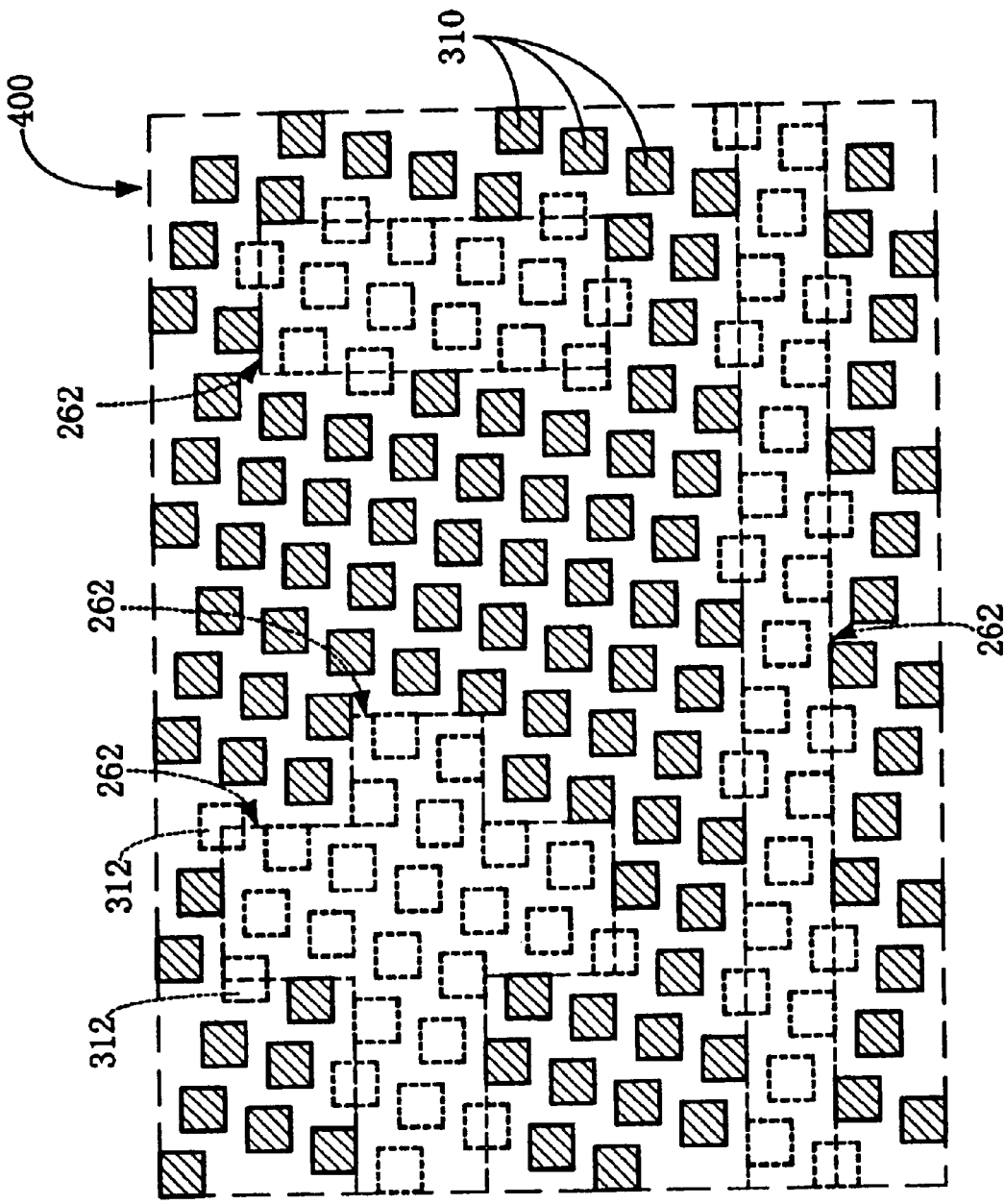
FIG. 14 shows a figure representing third mask data.

Next, the first mask data 200 and the second mask data 300 are mixed to form a third mask data 400. FIG. 14 shows a pattern representing the third mask data 400. For example, the first and second mask data 200 and 300 can be mixed in the following manner. Common areas of the hatched regions in the first mask data 200 and the dummy patterns (hatched regions) 310 of the second mask data 300 are extracted. In other words, the dummy patterns 310 that overlap the restriction region patterns 262 are excluded. It is noted that the dummy patterns 312 that partially overlap the restriction region patterns 262 are also entirely excluded.

Then, a logical sum of the third mask data 400 and the first and third intermediate mask data 210 and 230 is made. In other words, the hatched regions 212 and 232 of the first and third intermediate mask data 210 and 230 are added to the third mask data 400. As a result, mask data 500 shown in FIG. 15 is obtained for a mask that is used to form trench isolation regions in a semiconductor substrate.

When a positive type resist is used for forming the trench isolation regions in the semiconductor substrate, the hatched regions of the mask data 500 represent shading portions of the mask (for example, chrome patterns). When a negative type resist is used, regions other than the hatched regions (i.e., blank regions) of the mask data 500 represent shading portions of the mask (for example, chrome patterns).

The mask data 500 thus obtained can be recorded in a computer readable recording media if required. Also, a mask that is used to form trench isolation regions in a semiconductor substrate can be obtained based on the mask data 500.

In the method for generating mask data in accordance with the embodiments of the present invention, the dummy patterns 310 correspond to placement patterns of the dummy convex regions 32 as described above. As a result, for the same reasons described above in conjunction with the effects of the semiconductor device, the dummy patterns 310 can be securely generated in areas adjacent to the restriction regions 262 without controlling placement positions of the dummy patterns 310. In other words, the dummy patterns 310 can be automatically generated in areas adjacent to the restriction region patterns 262. As a result, when a mask is obtained by the method for generating mask data in accordance with the embodiments of the present invention, and such a mask is used to form dummy convex regions in a trench, dummy convex regions can be securely formed in areas adjacent to restriction regions. Accordingly, when a dielectric layer that is filled in the trench is polished, the polishing pressure is securely distributed on the dummy convex regions in areas adjacent to the restriction regions.

Also, the dummy patterns 310 that at least partially overlap the restriction region patterns 262 are entirely excluded. As a result, the generation of pattern skipping of dummy convex regions or scratches during polishing of the dielectric layer can be securely prevented.

Furthermore, since the dummy patterns 310 can be securely set in areas adjacent to the restriction region patterns 262, the dummy patterns 310 can also be securely set in regions where gaps between adjacent restriction region patterns 262 are narrow.

In accordance with the embodiments of the present invention, the step of generating the first mask data 200 include the step of diagrammatically reversing the sixth intermediate mask data 260. However, depending on software used for generating mask data, the step of diagrammatically reversing the sixth intermediate mask data 260 may not necessarily be included.

Experiments are conducted to show how patterns of dummy convex regions change the formation of the dummy convex regions between effective convex regions.

Condition s for embodiment samples will be described below.

(1) In accordance with one embodiment of the present invention, patterns of dummy convex regions are made according to the following rule:

(a) An angle between the first virtual linear lines and the row line is about 18.4 degrees.

(b) A gap between the adjacent t first virtual linear lines is about 3.2 µm.

(c) A n angle between the second virtual linear lines and the column line is about 18.4 degrees.

(d) A gap between the adjacent second virtual linear lines is about 3.2 µm.

(e) A ratio of an area of the dummy convex regions occupied in a unit area of a trench isolation region is 40%.

(f) A shape of each of the dummy convex regions in plan view is square.

(g) Each side of each of the dummy convex regions in plan view has a length of 2 µm.

(h) A gap between opposing sides of adjacent ones of the dummy convex regions disposed next to one another on the same one of the first virtual linear lines is 1 µm.

(i) A gap between opposing sides of adjacent ones of the dummy convex regions disposed next to one another on the same one of the second virtual linear lines is 1 µm.

(j) An offset width in the column direction between opposing sides of adjacent ones of the dummy convex regions disposed next to one another on the same one of the first virtual linear lines is 1 µm.

(k) An offset width in the row direction between opposing sides of adjacent ones of the dummy convex regions disposed next to one another on the same one of the second virtual linear lines is 1 µm.

(1) The dummy convex regions are formed such that their centers are located on the first virtual linear lines.

(m) The dummy convex regions are formed such that their centers are located on the second virtual linear lines.

(n) Any dummy convex regions that may entirely or partially overlap a restriction region 40 (including dummy convex regions connecting to a restriction region) are excluded.

(2) The restriction regions 40 include prohibited areas 44 and effective regions (i.e., effective convex regions) 42.

(3) The prohibited area 44 is set in an area around the effective region (i.e., the effective convex region) 42. The width of the prohibited area 44 is 1 µm.

A region A10 and a region B10 are set. In the region A10, a gap between adjacent ones of the effective regions (i.e., the effective convex regions) is 10 µm. In the region B10, a gap between adjacent ones of the effective regions (i.e., the effective convex regions) is 6 µm.

Conditions for comparison samples will be described below.

(1) In a comparison sample, dummy convex regions are disposed in the form of a lattice. More particularly, the dummy convex regions are disposed according to the following rule:

(a) A gap between adjacent ones of the dummy convex regions disposed next to one another in the row direction is 1 µm.

(b) A gap between adjacent ones of the dummy convex regions disposed next to one another in the column direction is 1 µm.

(c) A shape of each of the dummy convex regions in plan view is square.

(d) Each side of each of the dummy convex regions in plan view has a length of 2 µm.

(e) Any dummy convex regions that may entirely or partially overlap a restriction region 40 (including dummy convex regions connecting to the restriction region) are entirely excluded.

(2) The restriction regions 40 include prohibited areas 44 and effective regions (i.e., effective convex regions) 42.

(3) The restriction region 40 is set in an area around the effective region (i.e., the effective convex region) 42. The width of the restriction region 40 is 1 µm.

(4) The same patterns as those of the embodiment sample are used for patterns of the effective regions (i.e., the effective convex regions) 42. A region of the comparison sample corresponding to the region A10 of the embodiment sample is presented as B10, and a region of the comparison sample corresponding to the region A20 of the embodiment sample is presented as B20.

Figure 16:
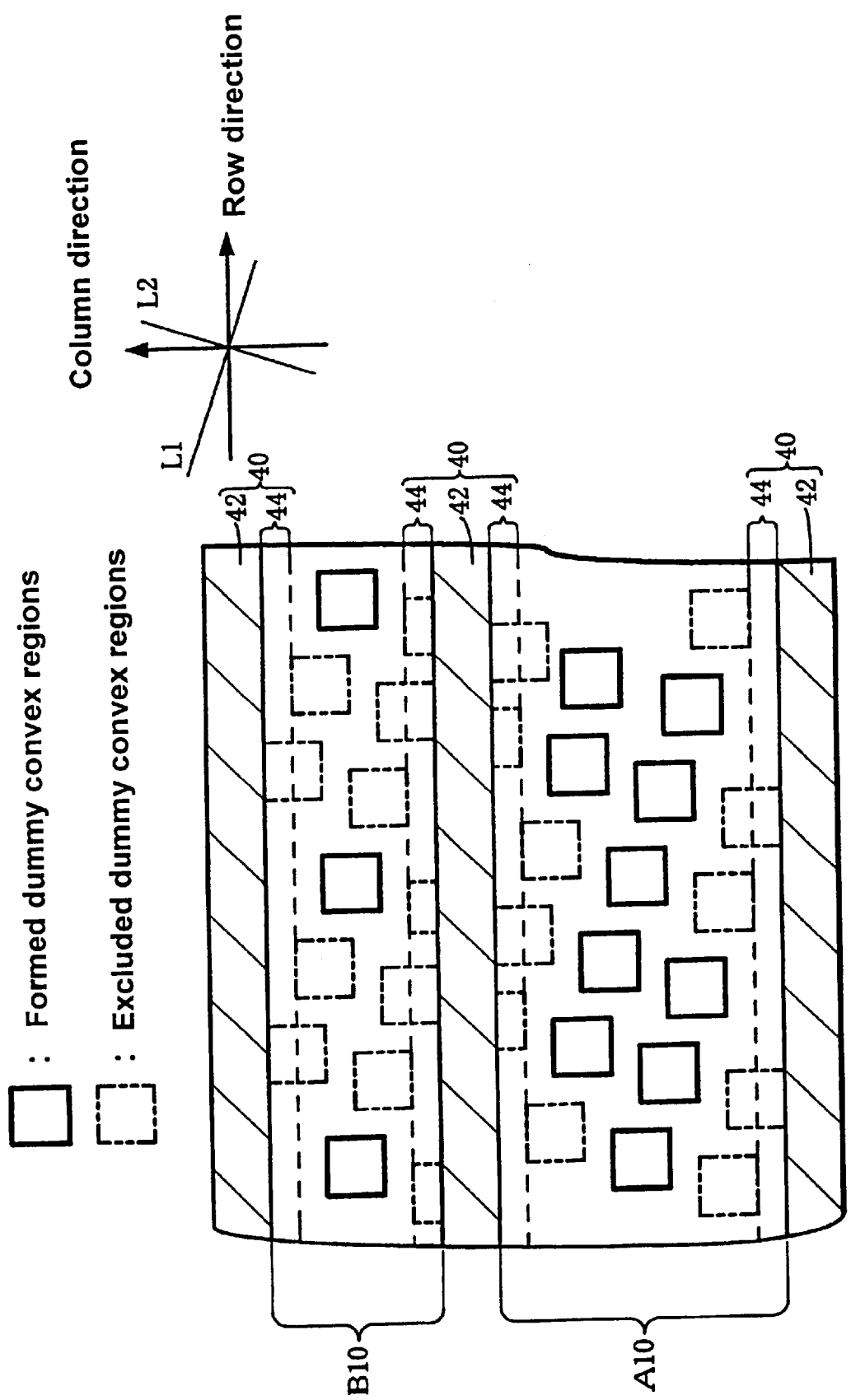
FIG. 16 shows a plan view of a semiconductor substrate in accordance with an embodiment of the present invention.
Figure 17:
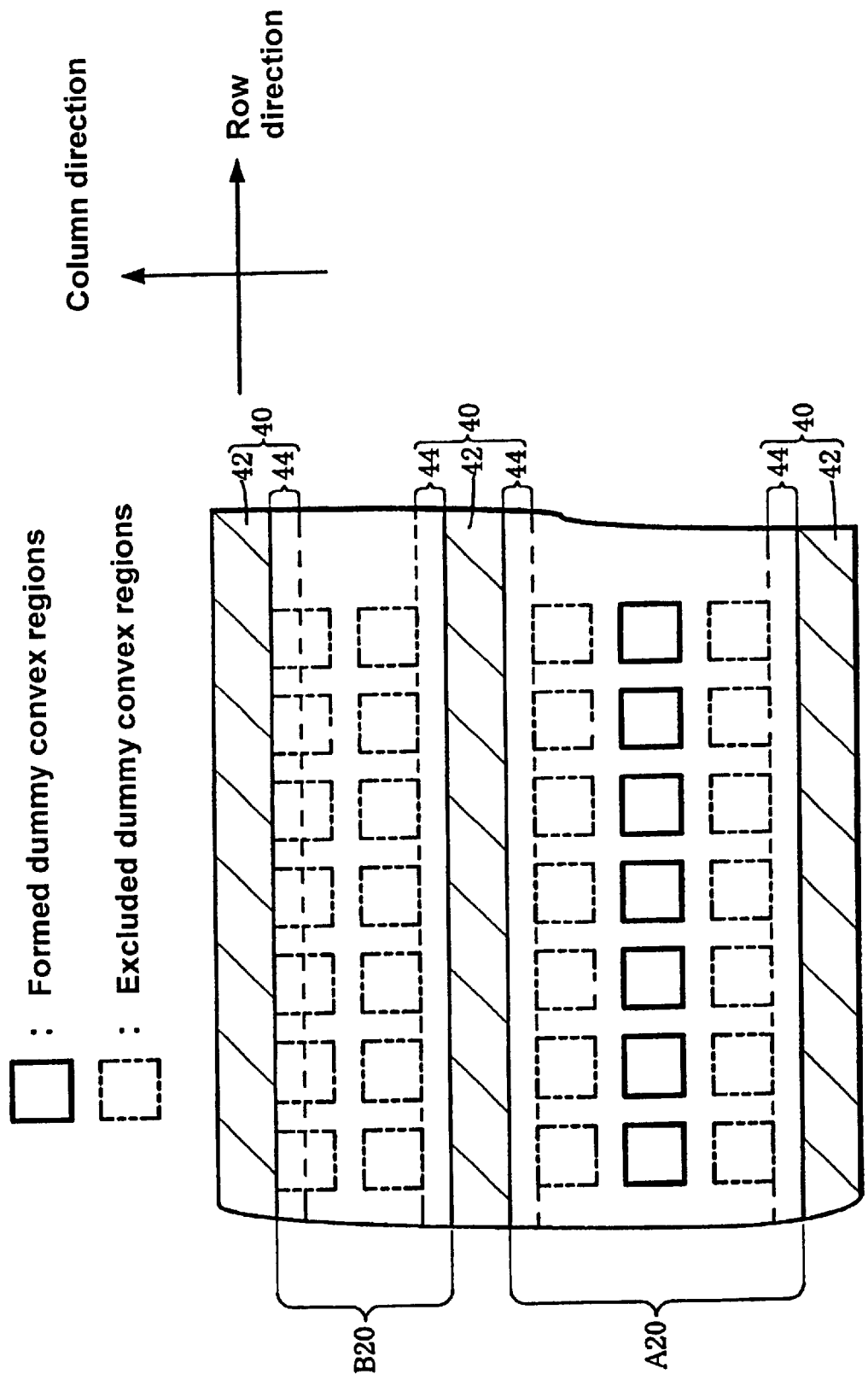
FIG. 17 shows a plan view of a semiconductor substrate of a comparison sample.
Figure 19:
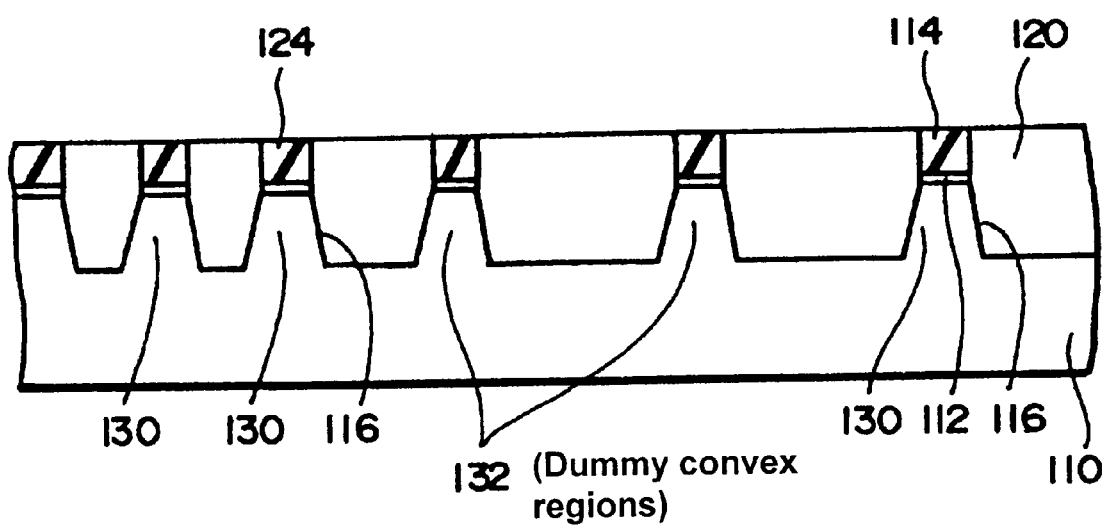
FIG. 19 schematically shows a cross-sectional view of a trench isolation region in which dummy convex regions are formed.

Comparison results are shown in FIGS. 16 and 17. FIG. 16 shows a plan view of a part of a semiconductor substrate of the embodiment sample of the present invention. FIG. 17 shows a plan view of a part of a semiconductor substrate of the comparison sample. In the figures, squares shown by solid lines indicate dummy convex regions that are actually formed, and squares shown by broken lines indicate virtual dummy convex regions that are excluded.

In the comparison example shown in FIG. 17, only one line of the dummy convex regions is formed in the region A20. In other words, dummy convex regions are not formed adjacent to the restriction regions 40. In contrast, as shown in FIG. 16, in accordance with the embodiment of the present invention, the dummy convex regions are securely formed in the region A10 in areas adjacent to the restriction regions 40.

In the embodiment sample of the present invention shown in FIG. 16, the dummy convex regions are formed in an area where the gap between the effective regions (i.e., the effective convex regions) is narrow (see the region B10). In contrast, in the comparison example shown in FIG. 17, dummy convex regions are not formed in an area where the gap between the effective regions (i.e., the effective convex regions) is narrow (see the region B20).

It is understood from the above that the embodiment sample of the present invention more securely form dummy convex regions in an element isolation region compared to the comparison example.

The present invention is not limited to the embodiments described above, and a variety of modifications can be made within the scope of the subject matter of the present invention.

What is claimed is:

1. A method for generating mask data that is used for a manufacturing method for a semiconductor device, the semiconductor device including: a trench isolation region, provided in a semiconductor substrate, defining a first direction and first virtual linear lines extending in a direction that traverses the first direction; and a plurality of dummy convex regions provided in the trench isolation region, wherein the first direction and the first virtual linear lines define an angle of 2 to 40 degrees, and, wherein the dummy convex regions are disposed on the first virtual linear lines, the method comprising the steps of:

(a) setting a restriction region pattern that defines a restriction region;

(b) setting dummy patterns that define the dummy convex regions; and (c) mixing the restriction region pattern and the dummy patterns, wherein the dummy patterns that at least partially overlap the restriction region pattern are entirely excluded.

2. A method for generating mask data according to claim 1, wherein the first virtual linear lines are spaced a specified gap from one another.

3. A method for generating mask data according to claim 2, wherein the specified gap is about 1–16 $\mu$m.

4. A method for generating mask data according to claim 1, wherein a center of each of the dummy convex regions is located on each of the first virtual linear lines.

5. A method for generating mask data according to claim 1, wherein the first direction is one of a row direction and a column direction perpendicular to the row direction.

6. A method for generating mask data according to claim 1, wherein the semiconductor device further includes a second direction perpendicular to the first direction and second virtual linear lines extending in a direction that traverses the second direction, wherein the second virtual linear lines and the second direction define an angle of about 2 to 40 degrees, and wherein the dummy convex regions are disposed on the second virtual linear lines.

7. A method for generating mask data according to claim 6, wherein the second virtual linear lines are spaced a specified gap from one another.

8. A method for generating mask data according to claim 7, wherein the specified gap is about 1–16 $\mu$m.

9. A method for generating mask data according to claim 6, wherein a center of each of the dummy convex regions is located on each of the second virtual linear lines.

10. A method for generating mask data that is used for a manufacturing method for a semiconductor device, the semiconductor device including; a trench isolation region, provided in a semiconductor substrate, defining a row direction and a column direction; and a plurality of dummy convex regions in the trench isolation region disposed in the row direction and the column direction, wherein each of the dummy convex regions has a generally plan square shape, the dummy convex regions that are disposed in the row direction are spaced a first distance from one another, the first distance being about a half of a side of each of the dummy convex regions, and the dummy convex regions that are disposed in the row direction are offset by a second distance from one another in the column direction, the second distance being about a half of a side of each of the dummy convex regions, the method comprising the steps of:
  (a) setting a restriction region pattern that defines a restriction region;
  (b) setting dummy patterns that define the dummy convex regions; and
  (c) mixing the restriction region pattern and the dummy patterns, wherein the dummy patterns that at least partially overlap the restriction region pattern are entirely excluded.

11. A method for generating mask data that is used for a manufacturing method for a semiconductor device, the semiconductor device including: a trench isolation region, provided in a semiconductor substrate, defining a row direction and a column direction; and a plurality of dummy convex regions in the trench isolation region disposed in the row direction and the column direction, wherein each of the dummy convex regions has a generally square plan shape, the dummy convex regions that are disposed in the column direction are spaced a first distance from one another, the first distance being about a half of a side of each of the dummy convex regions, and the dummy convex regions that are disposed in the column direction are offset by a second distance from one another in the row direction, the second distance being about a half of a side of each of the dummy convex regions, the method comprising the steps of:
  (a) setting a restriction region pattern that defines a restriction region;
  (b) setting dummy patterns that define the dummy convex regions; and
  (c) mixing the restriction region pattern and the dummy patterns, wherein the dummy patterns that at least partially overlap the restriction region pattern are entirely excluded.

12. A method for generating mask data according to claim 10, wherein the dummy convex regions that are disposed in the column direction are spaced a third distance from one another, the third distance being about a half of a side of each of the dummy convex regions, and the dummy convex regions that are disposed in the column direction are offset by a fourth distance from one another in the row direction, the fourth distance being about a half of a side of each of the dummy convex regions.

13. A semiconductor device according to claim 10, wherein each side of each of the dummy convex regions has a length of about 2 $\mu$m.

14. A method for generating mask data according to claim 1, wherein the restriction region includes an effective region and a prohibited area.

15. A method for generating mask data according to claim 13, wherein the effective region includes an active region, a gate region, an impurity diffusion region formed to function as a resistance and a boundary region between an n-well and a p-well.

16. A method for generating mask data that is used for a manufacturing method for a semiconductor device, the semiconductor device including: a trench isolation region provided in a semiconductor substrate; and a plurality of dummy convex regions provided in the trench isolation region, the method comprising the steps of:
  (a) setting a restriction region pattern that defines a restriction region;
  (b) setting dummy patterns that define the dummy convex regions, and defining a row direction and first virtual linear lines extending in a direction that traverses the row direction, wherein the row direction and the first virtual linear lines define an angle of 2 to 40 degrees, and the dummy convex regions are disposed on the first virtual linear lines; and
  (c) mixing the restriction region pattern and the dummy patterns, wherein the dummy patterns that at least partially overlap the restriction region pattern are entirely excluded.

17. A method for generating mask data that is used for a manufacturing method for a semiconductor device, the semiconductor device including: a trench isolation region provided in a semiconductor substrate; and a plurality of dummy convex regions provided in the trench isolation region, the method comprising the steps of:
  (a) setting a restriction region pattern that defines a restriction region;
  (b) setting dummy patterns that define the dummy convex regions, and defining a column direction and second virtual linear lines extending in a direction that traverses the column direction, wherein the column direction and the second virtual linear lines define an angle of 2 to 40 degrees, and the dummy convex regions are disposed on the second virtual linear lines; and (c) mixing the restriction region pattern and the dummy patterns, wherein the dummy patterns that at least partially overlap the restriction region pattern are entirely excluded.

18. A method for generating mask data according to claim 16, wherein the step (b) defines a column direction and second virtual linear lines extending in a direction that traverses the column direction, wherein the second virtual linear lines and the column direction define an angle of about 2 to 40 degrees, and wherein the dummy convex regions are disposed on the second virtual linear lines.

19. A method for generating mask data that is used for a manufacturing method for a semiconductor device, the semiconductor device including: a trench isolation region, provided in a semiconductor substrate, defining a row direction and a column direction; and a plurality of dummy convex regions in the trench isolation region disposed in the row direction and the column direction, wherein placement of the plurality of dummy convex regions is determined by a method including the steps of:

(a) setting a restriction region pattern that defines a restriction region;

(b) setting dummy patterns that define the dummy convex regions, wherein each of the dummy convex regions has a generally square plan shape, the dummy convex regions that are disposed in the row direction are spaced a first distance from one another, the first distance being about a half of a side of each of the dummy convex regions, and the dummy convex regions that are disposed in the row direction are offset by a second distance from one another in the column direction, the second distance being about a half of a side of each of the dummy convex regions; and (c) mixing the restriction region pattern and the dummy patterns, wherein the dummy patterns that at least partially overlap the restriction region pattern are entirely excluded.

20. A method for generating mask data that is used for a manufacturing method for a semiconductor device, the semiconductor device including: a trench isolation region, provided in a semiconductor substrate, defining a row direction and a column direction; and a plurality of dummy convex regions in the trench isolation region disposed in the row direction and the column direction, wherein placement of the plurality of dummy convex regions is determined by a method including the steps of:

(a) setting a restriction region pattern that defines a restriction region;

(b) setting dummy patterns that define the dummy convex regions, wherein each of the dummy convex regions has a generally square plan shape, the dummy convex regions that are disposed in the column direction are spaced a first distance from one another, the first distance being about a half of a side of each of the dummy convex regions, and the dummy convex regions that are disposed in the column direction are offset by a second distance from one another in the row direction, the second distance being about a half of a side of each of the dummy convex regions; and (c) mixing the restriction region pattern and the dummy patterns, wherein the dummy patterns that at least partially overlap the restriction region pattern are entirely excluded.

21. A method for generating mask data according to claim 20, wherein the dummy convex regions that are disposed in the column direction are spaced a third distance from one another, the third distance being about a half of a side of each of the dummy convex regions, and the dummy convex regions that are disposed in the column direction are offset by a fourth distance from one another in the row direction, the fourth distance being about a half of a side of each of the dummy convex regions.

22. A method for generating mask data according to claim 16, wherein the restriction region includes an effective region and a prohibited area provided around the effective region, and wherein the step (a) includes the steps of:

(a-1) setting an effective region pattern that defines the effective region; and (a-2) setting a prohibited area pattern that defines the prohibited area about the effective region pattern.

23. A method for generating mask data according to claim 22, wherein the effective region pattern includes an active region pattern, a gate region pattern, an impurity diffusion region pattern formed to function as a resistance and a boundary region pattern between an n-well and a p-well.

24. A method for generating mask data according to claim 16, further comprising, before the step (c), step (d) of reversing the restriction region pattern.

25. A mask formed by the method for generating mask data according to claim 1.

26. A computer readable recording medium that stores mask data obtained by the method for generating mask data according to claim 1.

* * * * *